(12) United States Patent
Jain et al.

(10) Patent No.: US 8,294,137 B2
(45) Date of Patent: Oct. 23, 2012

(54) TWIN-DRAIN SPATIAL WAVEFUNCTION SWITCHED FIELD-EFFECT TRANSISTORS

(76) Inventors: Faquir Chand Jain, Storrs, CT (US); Evan Heller, Glastonbury, CT (US)

( * ) Notice: Subject to any disclaimer, the term of this patent is extended or adjusted under 35 U.S.C. 154(b) by 266 days.

(21) Appl. No.: 12/655,609

(22) Filed: Jan. 4, 2010

(65) Prior Publication Data

US 2010/0224861 A1    Sep. 9, 2010

Related U.S. Application Data

(60) Provisional application No. 61/204,184, filed on Jan. 2, 2009.

(51) Int. Cl.
*H01L 29/06* (2006.01)
(52) U.S. Cl. ............... 257/24; 257/20; 257/E29.072
(58) Field of Classification Search ............ 257/20, 257/24, 241
See application file for complete search history.

(56) References Cited

U.S. PATENT DOCUMENTS

| | | | | |
|---|---|---|---|---|
| 5,412,224 A * | 5/1995 | Goronkin et al. | ............... | 257/15 |
| 6,469,315 B1 * | 10/2002 | Suzuki et al. | ................... | 257/20 |
| 7,612,366 B2 * | 11/2009 | Mears et al. | ................... | 257/20 |

* cited by examiner

*Primary Examiner* — Daniel Whalen
(74) *Attorney, Agent, or Firm* — Steven M. McHugh

(57) ABSTRACT

A field-effect transistor is provided and includes source, gate and drain regions, where the gate region controls charge carrier location in the transport channel, the transport channel includes a asymmetric coupled quantum well layer, the asymmetric quantum well layer includes at least two quantum wells separated by a barrier layer having a greater energy gap than the wells, the transport channel is connected to the source region at one end, and the drain regions at the other, the drain regions include at least two contacts electrically isolated from each other, the contacts are connected to at least one quantum well. The drain may include two regions that are configured to form the asymmetric coupled well transport channel. In an embodiment, two sources and two drains are also envisioned.

17 Claims, 25 Drawing Sheets

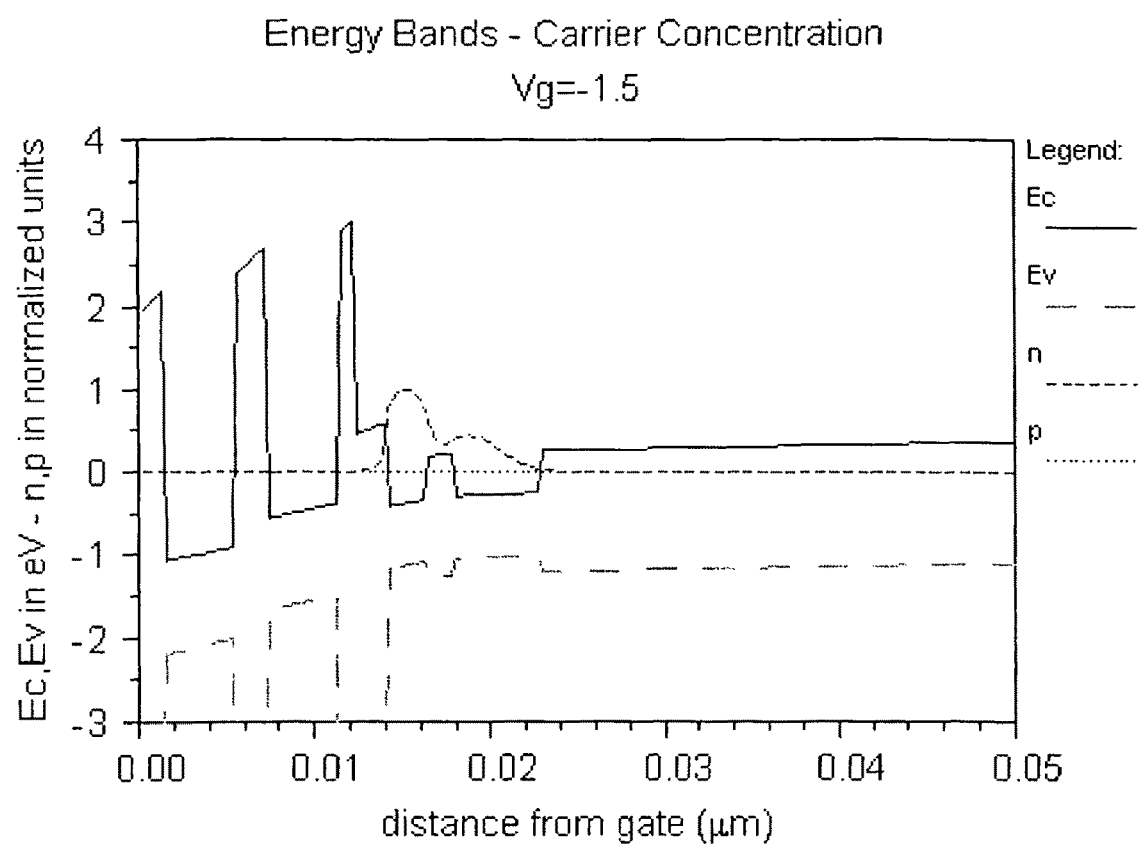
Figure 4D(II)

TWIN-DRAIN SPATIAL WAVEFUNCTION SWITCHED FIELD-EFFECT TRANSISTORS

CROSS REFERENCE TO RELATED APPLICATIONS

This application claims priority to U.S. Provisional Patent Application No. 61/204,184, filed Jan. 2, 2009 and is related to U.S. patent application Ser. No. 12/006,974, filed Jan. 9, 2008, the contents of both of which are incorporated herein by reference in their entireties.

STATEMENT REGARDING FEDERALLY SPONSORED RESEARCH

The United States Government has certain rights in this invention pursuant to National Science Foundation Grant No. CCR-0210428 and Office of Naval Research Contract No. N00014-06-1-0016.

FIELD OF THE INVENTION

The disclosure relates generally to Field Effect Transistors (FETs) and MOS devices and more particularly to Field Effect Transistors (FETs) and MOS devices where the transport channel may include an asymmetric coupled well structure which may have more than one well and an appropriate number of barrier layers that form the basic FET structure.

BACKGROUND OF THE INVENTION

As is known, conventional Field-Effect Transistors (FETs) comprise one transport channel, which is generally induced by the application of a gate voltage above a threshold value. It has one source and one drain. Although a FET may have one or more gates, typically there is only one top gate which is formed above the transport channel having an appropriate thin gate insulator layer. Additionally, Field-Effect Transistors (FETs) having a back gate have also been reported. Moreover, there are also FIN-FETs where the gate region surrounds the semiconductor. All of these structures have the common characteristic that there is one channel which is connected to one drain. When used in logic circuits, conventional FETs are limited and are typically used to process one bit of information at a time. For example, in complementary metal oxide semiconductor (CMOS) inverters (a NOT logic gate), there is one input and one output. The input is connected to the gate which is formed by electrically connecting the gates of an n-channel FET and a p-channel. FET and the logic output is connected to the drain regions of both transistors which are also electrically connected. As such, when an input is high (e.g. logic state "1") the output is low (e.g. logic state "0").

SUMMARY OF THE INVENTION

A Spatial Wavefunction Switching (SWS) field-effect transistor device is provided and includes a source region, a gate region, and a drain region, wherein the gate region includes a thin gate insulator layer and at least one additional layer configured to serve as an electrical gate contact, the gate region being configured to control charge carrier location in a transport channel, wherein one end of the transport channel is located in proximity to the source region and the other end of the transport channel is located in proximity to the drain region, the transport channel includes a asymmetric coupled quantum well layer having at least two quantum wells and at least two barrier layers, wherein the at least two quantum wells and barrier layers are selected from semiconductor materials and wherein the at least two quantum wells are implemented using materials having a lower energy gap than materials used to implement the barrier layers, wherein the at least two quantum wells including an upper well and a lower well, each of the upper well and the lower well having a well thickness and a well material composition, wherein the upper well and the lower well differ in the well thickness, and wherein the at least two barrier layers include an upper barrier and a lower barrier, the lower barrier being located in proximity to a substrate region, wherein one side of the upper well is located in proximity to the thin gate insulator layer and the other side of the upper well is located in proximity to the upper barrier, and wherein one side of the lower well is located in proximity to the upper barrier and the other side of the lower well is located in proximity to the lower barrier, and wherein the transport channel, includes at least one of the quantum wells and at least one of the barriers and is located on top of a semiconductor layer, wherein the semiconductor layer is hosted on a substrate selected from semiconductor selected from a list of Si, Ge, InP, GaAs, SiC, ZnSe, ZnS, and wherein the drain region includes two contacts electrically isolated from each other, wherein one of the two contacts is connected to the upper well to form a first drain region and the other of the two contacts is connected to the lower well to form a second drain region, and wherein the source region includes at least one contact, wherein the at least one contact is connected to at least one of the upper quantum well and the lower quantum well to form at least one source input.

A logic circuit having two field-effect transistors configured as a Complementary Metal Oxide Semiconductor (CMOS) inverter with at least two outputs is provided and includes an n-channel field-effect transistor having a n-channel source region, a n-channel drain region, a n-channel gate region and a n-channel transport channel, wherein the n-channel transport channel is configured to host electrons when the n-channel gate region is biased above a first threshold level, the n-channel transport channel being associated with a p-type substrate region, and a p-channel field-effect transistor having a p-channel source region, a p-channel drain region, a p-channel gate region and a p-channel transport channel, wherein the p-channel transport channel is configured to hosts holes when the p-channel gate region is biased above a second threshold level, the p-channel transport channel being associated with a n-type substrate region. The n-channel gate region and the p-channel gate region are electrically connected, wherein the n-channel drain region includes a first n-channel drain and a second n-channel drain and the p-channel drain region includes a first p-channel drain and a second p-channel drain, the first n-channel drain being connected to the first p-channel drain to form one of the at least two outputs and the second n-channel drain being connected to the second p-channel drain to form the other of the at least two outputs. Moreover, the n-channel source region is connected to at least one of a common ground potential or a common bias potential, and the p-channel source region is connected to a supply voltage.

A logic circuit having two SWS field-effect transistors configured as a Complementary Metal Oxide Semiconductor (CMOS) inverter with at least two outputs is provided and includes an n-channel field-effect transistor having a n-channel source region, a n-channel drain region, a n-channel gate region and a n-channel transport channel, wherein the n-channel transport channel is configured to host electrons when the n-channel gate region is biased above a first threshold level, the n-channel transport channel being associated with a p-type substrate region, and a p-channel field-effect transistor having a p-channel source region, a p-channel drain region, a p-channel gate region and a p-channel transport channel, wherein the p-channel transport channel is configured to hosts holes when the p-channel gate region is biased above a second threshold level, the p-channel transport channel being associated with a n-type substrate region, wherein the n-channel gate region and the p-channel gate region are electrically connected, and the said gate region is connected to an input signal, and wherein the n-channel includes an upper quantum well and a lower quantum well, the upper quantum well and the lower quantum well forming asymmetric coupled quantum wells, the asymmetric coupled quantum wells separated by barrier layers, and wherein the upper quantum well n-channel is connected to first drain region, and the lower well n-channel connected to second drain region, wherein the p-channel includes an upper quantum well and a lower quantum well the upper quantum well and the lower quantum well forming an asymmetric coupled quantum wells, the wells separated by barrier layers, and wherein the upper quantum well p-channel is connected to first drain region, and the lower well p-channel connected to second drain region, the first drain region of the n-channel is connected to the first drain region of the p-channel to form one of the at least two outputs, and the second drain region of the n-channel is connected to the second drain region of the p-channel to form the other of the at least two outputs, and wherein the n-channel source region is connected to at least one of a common ground potential or a common bias potential, and the p-channel source region is connected to a supply voltage.

A three-state field-effect transistor device is provided and includes a source region, a gate region, and a drain region, wherein the gate region is configured to control charge carrier location in a transport channel region, wherein the transport channel region includes a asymmetric coupled quantum well layer having at least two quantum wells of different thicknesses, separated by a barrier layer having a greater energy gap than the at least two quantum wells. Furthermore, the transport channel region is connected to the source region at a first transport channel end and the drain region at a second transport channel end, and wherein the drain region includes at least two contacts electrically isolated from each other and connected to at least one of the at least two quantum wells, and wherein the gate region includes a multilayer structure having a first thin insulator layer of about 10-100Å in thickness, the first thin insulator layer being deposited on top of a semiconductor region hosting the transport channel region between the source region and the drain region, wherein a surface of the first thin insulator layer includes at least two layers of cladded quantum dots, wherein the top surface of the at least two layers of cladded quantum dot includes at least one of a semiconductor layer or a metal layer.

A three-state field-effect transistor device is provided and includes a source region, a gate region, and a drain region, wherein the gate region is configured to control charge carrier location in a transport channel region, wherein the transport channel region includes a asymmetric coupled quantum well layer having at least two quantum wells of different thicknesses, separated by a barrier layer having a greater energy gap than the at least two quantum wells, wherein the transport channel region is connected to the source region at a first transport channel end and the drain region a second transport channel end, and wherein the transport channel is hosted on a semiconductor layer doped to provide at least one of an n-channel or a p-channel, the semiconductor layer being hosted on a substrate region, and wherein the drain region includes at least two contacts electrically isolated from each other and connected to at least one of the at least two quantum wells, and wherein the gate region includes a multilayer structure having a first thin insulator layer of about 10-100Å in thickness, the first thin insulator layer being deposited on top of a semiconductor region hosting the transport channel region between the source region and the drain region, wherein a surface of the first thin insulator layer includes at least two layers of cladded quantum dots, wherein the top surface of the at least two layers of cladded quantum dot includes at least one of a semiconductor layer, a second thin insulator or a metal layer.

BRIEF DESCRIPTION OF THE DRAWINGS

The foregoing and other features and advantages of the present invention will be more fully understood from the following detailed description of illustrative embodiments, taken in conjunction with the accompanying figures in which like elements are numbered alike:

FIG. 1(*b*) shows the cross-sectional schematic of a non-volatile memory with two layers of cladded quantum dots and with details of layers forming the asymmetric coupled well (ACQ) transport channel.

FIG. 1(*c*) represents the Energy band for the strained layer asymmetric coupled well transport channel. Electron wave function (dashed line) can be made to reside in the lower quantum well.

FIG. 1(*d*) Conventional FET having an n-channel induced on p-Si substrate, in accordance with the prior art.

FIG. 2(*b*) shows a 3-state FET with asymmetric coupled well channel having cladded ZnCdSe—CdSe cladded quantum dots in the gate region.

FIG. 3(*b*) shows Carriers in the Lower Well (dashed line) when the gate voltage is just above the threshold value.

FIG. 3(*c*) shows Carriers primarily in the upper quantum well (gate voltage is significantly above the threshold).

FIG. 3(*d*) shows a three-dimensional schematic of a Si based SWS-FET.

FIG. 4(*a*) shows a Twin-drain n-channel SWS-FET illustrated using InGaAs—InAlAs—InGaAs asymmetric coupled well structure on InP substrate. The drain contact D1 is such that it contacts only the upper well.

FIG. 4(*b*) shows a Cross sectional schematic of n-channel twin-drain SWS-FET showing drain contact to Drain 2 (lower well).

FIG. 4*d*(*ii*) shows an InGaAs based ACQW device with QD gate showing carriers in upper well.

FIG. 4(e) 3-dimensional InGaAs based ACQW device with two drain connections (no QDs in the gate region).

FIG. 9 shows a Drain 2 of is contacted from the back side. Now D1 will not be connected when D2 is ON.

BRIEF DESCRIPTION OF THE INVENTION

As disclosed herein, an asymmetric coupled quantum well transport channel is described and may be formed on an appropriate substrate by forming at least two quantum wells having different thicknesses and/or material compositions and including a barrier layer between them. Generally, the lower well may be thicker than the top well (which is adjacent to the gate insulator). In the present invention, the location of carriers and their associated wavefunctions may be switched from the lower well to the upper well by the application of a gate voltage (for a given source to drain voltage biasing). This spatial wavefunction switching (SWS) feature is used to design novel twin-drain SWS FETs. In one embodiment, the twin-drain SWS FET includes a single source, two channels (separated by an insulating region) with one common gate and two drains (drain #1 and drain #2) connecting each of the two channels. One of the two drains contacts the lower well while the other of the two drains contacts the upper well. Depending on the gate voltage, the wavefunction peak (and thus carrier density) switches between the channel connected to drain #1 and the channel connected to drain #2, causing the overall channel current to be routed to one drain or the other, as a function of gate voltage. This process of using spatial wavefunction switching to route current (and thus electrical signals) between contacts will subsequently be referred to as spatial routing.

In another embodiment, two sources may be connected separately like twin drains, providing twin-source, twin-drain and top gate and/or top and back gates. In still yet another embodiment three (or more) quantum wells and commensurate barrier layers are configured to form the transport channels, and these FETs can be configured as 3-drain SWS FETs or two drains depending on the application. For example, when a gate voltage is applied, one or more of the three quantum wells hosts carriers (i.e. electrons in n-channel and holes in p-channel) thus providing an electrical connection between respective source(s) and drain(s) regions. Thus, the gate voltage can be used to route the signal connected to one of the sources to the respective drain. In the case where all of the sources are commonly connected, the signal appearing at the source can be routed to one of the two or three drains as desired. Accordingly, combining the twin-drain structures with quantum dot gates leads to versatile nonvolatile memories and 3-state devices with spatial routing.

It should be appreciated that as disclosed herein in accordance with the present invention, the speed of the SWS structures of the present invention and their applicability to multivalued logic (processing more than one bit at a time; reducing number of FETs used for a given logic function) makes them superior over conventional devices.

Figure 1A:
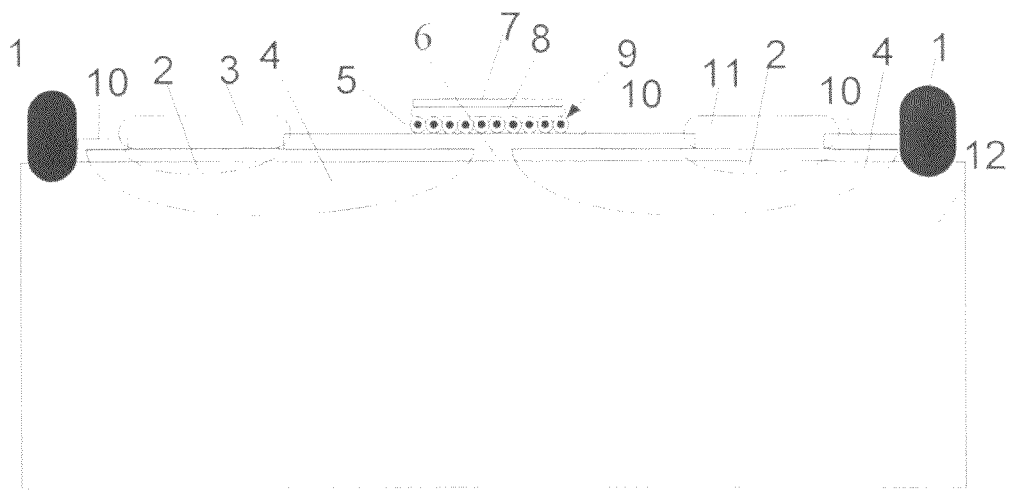
FIG. 1(*a*) shows the cross-sectional schematic of a non-volatile memory with asymmetric coupled well transport channel with strained Si wells and SiGe barrier layer realized on Si substrate layer. The accompanying figure shows schematically the wavefunctions in the well.
Figure 1B:
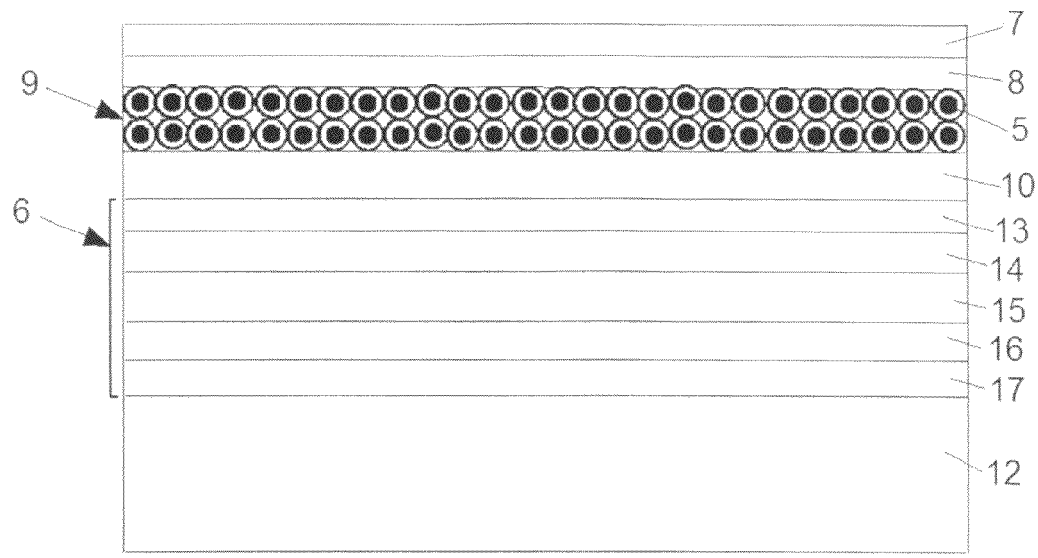
Figure 2:
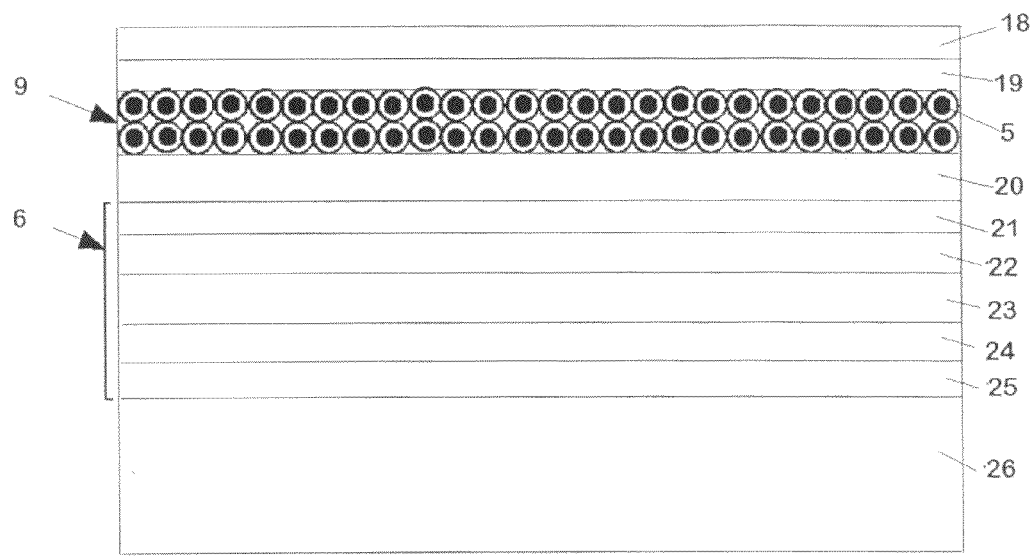
FIG. 2 (*a*) shows a three-state field-effect transistor having two layers of cladded $SiO_x$—Si quantum dots on InGaAs—InAlAs asymmetric coupled quantum well transport channel realized on InP substrate.

Asymmetric coupled quantum well (ACQW) structures (as shown in FIG. 1A, FIG. 1B and FIG. 2) were reported for the enhancement of the retention time in a nonvolatile memory and as three-state FETs. Here, the gate is shown with a layer or layer(s) of cladded nanoparticles or cladded quantum dots. Depending on the configuration of the gate layers consisting of cladded quantum dots and insulating layers, the structure behaves as a fast access nonvolatile memory structure or as a FET exhibiting multiple states (such as three-state or bistability) in its drain current-gate voltage characteristics (also known as transfer characteristics).

These structures can be realized on a lattice-matched gate insulator (such as ZnMgS, ZnBeMgS, etc.) with appropriate energy gap providing sufficient energy barrier for carriers in the channel. The floating gate may include an array of cladded $SiO_x$—Si (or $GeO_x$—Ge) quantum dots deposited on a ZnMgS gate insulator. The basic FET is shown in Si material system. However, it is contemplated that these structures can also be realized in other material systems, such as InGaAs—InP. FIG. 2 (a) illustrates a three-state field-effect transistor including two layers of cladded $SiO_x$—Si (or $GeO_x$—Ge) quantum dots on InGaAs—InAlAs asymmetric coupled quantum well transport channel realized on a InP substrate. It should be appreciated that The ACQW channel configuration can also be implemented in modulation doped field-effect transistor (MODFET) structures. Still yet another embodiment may include a MODFET configured as self-aligned MOS gate incorporating QD layers.

This disclosure further describes an asymmetric coupled quantum well (ACQW) transport channel FET, which confines carriers in either the lower of the two wells (in proximity to the substrate), both wells, and/or upper well (proximity to the gate insulator). As the gate voltage is increased in n-channel devices, the carrier wavefunction spatial location changes which shifts the charge location. This device is referred to as spatial wavefunction switched (SWS) FET. It should be appreciated that a Spatial Wavefunction Switched (SWS) FET (having two coupled well channel) provides four states 00, 01, 10, 11 corresponding to the wavefunction being OFF (00), in well W2 (01), in both wells W2-W1 (10), and in Well 1 (11). It should be appreciated that other state assignments may be selected depending on the application. For example, in a logic design it may be desired to assign '00' for no carriers in any well, '01' for carriers in well W2 (lower well), '11' when carriers are in both wells, and '10' when carriers are only in the upper well W1. Alternately, if three wells are used, the logic state assignment may be: '00' when carriers in not is any of the three wells, '01' when carriers are in the lowest well W3, '10' when carriers in are the middle well W2, and '11' when carriers are in the uppermost well W1. Still in another embodiment, when using three wells, one may reserve the carrier locations for logic states in the lower two wells and reserve the carriers in the upper wells for "Carry" bit(s). That is, use '00' when carriers are not in either well W3 or W2, '01' when carriers are in well W3, '10' when carriers are in W3 and W2, and '11' when carriers are in well W2. The use of the three well SWS device when only two wells are used for the processing of 4 states and the upper most well W1 is reserved for 'Carry' bit(s), may be done in conjunction with lateral charge transfer. In this case, two SWS structures, without a specific drain region in one device and a source region in the other device, are located in proximity to each other with their respective gates separated by a thin region. The charge can then be transferred from the well or wells of one SWS device to the device which is in proximity to it when the gate voltage(s) are adjusted in a manner that there is a greater demand in it. This is similar to the charge transfer in charge coupled devices (CCDs). The lateral transfer of charge is shown in FIG. 5f.

Simulation on appropriately designed ACQW FETs has revealed the spatial switching both in SiGe and InGaAs coupled well FETs, as well as other types of FETs. It is contemplated that the assignment of logic states to location of charges/wavefunction may be as desired and may vary depending on the applications (or other parameter as desired). The concept is further extendable to 3 or more wells. Furthermore, in FETs where the width (Z) of the channel is small, the transport channel may be treated as asymmetric coupled quantum wire FET. In addition, quantum wire FETs in which the channel length (L) is sub-12 nm (mask feature or under saturation) may be treated as quantum dot FETs with SWS type behavior. In this case the quantum dots are vertically coupled.

Furthermore, an asymmetric coupled quantum well (ACQW) transport channel may be formed when the lower quantum well is of a different thickness than the upper well, thus localizing the channel carriers in one of the wells. In this case, the wavefunctions/carrier location gets more pronounced and results in additional states when the transport channel length and width are reduced and configured as a quantum dot.

Disclosed also herein are twin-drain SWS FET structures and a method of fabricating them. One embodiment of this feature includes the novel twin-drain SWS FET which includes a single source, a single gate and two electrically isolated drain regions, each connecting at least one of the two quantum wells. In another embodiment, one (D2) of the two drains contacts the lower well (W2) while the other contacts the upper well (W1). Depending on the gate voltage, the current flows in drain 1 (D1), drain 2 (D2) or both. This provides spatial routing of current to one of the two drains. The structure permits use of quantum well layers each with different material mobility (obtained via material composition which determines the bandgap, effective masses, and the strain), allowing each channel to have unique I-V characteristics. Similarly, twin sources, S1 and S2, may be formed by having an independent source contact for each of the two wells.

If the SWS FET is implemented on a p-type substrate (or p-type semiconductor layer on a substrate), then the transport channel may be n-type. Similarly, p-channel SWS FET can be formed on a n-type substrate (or n-type semiconductor layer). Having both channel types permits implementation of well-known low-power complementary metal oxide semiconductor (CMOS) logic circuits. For example, an SWS FET based inverter may comprise two SWS FETs, one n-channel and one p-channel, sharing a common gate. The source of the p-channel FET may be connected to supply voltage (VDD) while the source of the n-channel FET may be connected to ground. The drains D1s and drains D2s of each FET may be connected, forming two outputs. Such a configuration may be considered as a routing device where the route depends on the magnitude of the input gate voltage. Similarly, if twin sources are also used, different VDD levels may be applied to each, giving rise to multilevel logic circuits.

In yet another embodiment, two twin-drain n-channel SWS FETs may be connected to perform a CMOS inverter operation. In this case, the drain D1 of one FET (T2) may be connected to the drain D2 (and/or drain D3 in case of 3 quantum wells) of the other FET (T1). The remaining drains may be allowed to float. This configuration provides for high frequency CMOS operations as compared with n- and p-channel FET based conventional CMOS logic. In this embodiment the two SWS-FETs may have different channel width (Z) to length (L) ratios for the appropriate logic functionality.

Additionally, cascaded twin-drain SWS FETs can be used for spatial routing of signals. The SWS-FET structures can also be implemented in conventional semiconductor-on-insulator (SOI) configuration. In still yet another embodiment, one of the two drains contacts the lower well while the other contacts both the wells.

Still yet another embodiment includes incorporating cladded quantum dot (such as $SiO_x$—Si or $GeO_x$—Ge) layers that form gate structures in the SWS configuration that enable: (1) nonvolatile memories, and (2) 3-state FETs (also 3 or more states).

Still yet another embodiment includes the adoption of modulation doped gate field-effect transistor (MODFET) structures, where the MODFET may be configured as a MOS-gate incorporating QD layers. These are desirable because they have a self-aligned gate.

In accordance with one embodiment of the present invention, FIG. 1(a) shows a cross-sectional schematic of a non-volatile memory with an asymmetric coupled quantum well transport channel 6 having strained Si wells (see elements 13 and 15 in FIG. 1(b)) and SiGe barrier layers (see elements 14 and 16 in FIG. 1(b)) realized on a Si substrate 12. Here, cladded Si dots 5 form a floating gate layer 9 between two layers of insulators (shown as tunnel gate insulator 10 (gate insulator #1) and control gate insulator 8 (gate insulator #2)). The source-drain structures are configured in lightly doped sheath (LDS) structure 4. The n+ doped ohmic regions 2 include an n+ source 2-1 having a source contact 3 and an n+drain 2-2 having a drain contact 11 and are contiguous to LDS structure 4. The source contact 3 and drain contact 11 are formed on n+ regions 2. The control gate insulator 8 (gate insulator #2) may be contacted by a layer 7 (such as poly-Si) which may or may not be doped. The metal contact to this layer is not shown in the figure.

Referring to FIG. 1(b), a cross-sectional schematic of the nonvolatile memory of FIG. 1(a) is illustrated and includes floating gate layer 9 which may be formed by one or more (in this case two) layers of $SiO_2$-cladded Si quantum dots 5 and provides details of the layers forming the asymmetric coupled well (ACQW) transport channel 6, which may include two wells, an upper well 13 and a lower well 15, and two barriers, a first barrier layer 14 and a second barrier layer 16. The second barrier layer 16 may be deposited on a p-SiGe layer 17 which in turn may be grown on the p-Si substrate 12. The upper quantum well 13 has a thin gate insulator 10 (i.e. tunnel gate insulator), which may be selected from a lattice-matched epitaxial layer, such as, but not limited to, ZnMgS and ZnMg-BeSSe. Alternately, the lattice-matched epitaxial layer could be $SiO_2$ or $HfO_2$ or some other high-k layers or any desired combination of layers suitable to the desired end purpose. In addition, the control gate insulator layer 8 may be on top of floating gate layer 9. Moreover, layer 7 may be constructed from any material or combination of materials suitable to the desired end purpose, such as a metal layer, a poly-Si and/or a poly-SiGe layer which could be grown. It should be appreciated that when poly-semiconductor layers are grown, there may be a need to have a metal contact layer (not shown in the figure). In accordance with the present invention, the gate insulator may have one or more layers as desired, where each of the layers may be constructed from the same materials or each may be constructed from different materials. These materials may be semiconductor and/or non-semiconductor materials.

Figure 1C:
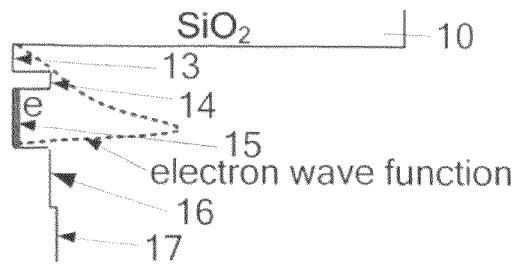

Referring to FIG. 1(c) an energy band for the strained layer asymmetric coupled well transport channel of FIG. 1(a) is illustrated. It should be appreciated that the electron wave function (dashed line) can be made to reside in the lower quantum well 15.

Figure 1D:
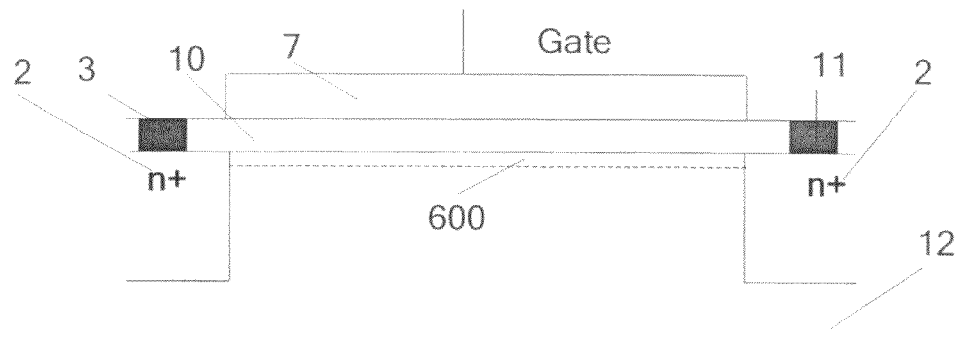

Referring to FIG. 1(d), a conventional n-channel FET realized on p-Si substrate is shown in accordance with the prior art. The source (3-22) and drain (11-24) contacts are shown on n+ doped regions (2-26). The gate insulator (10-28) is on the transport channel 600 which has no explicit quantum wells and barriers. This is a single channel device where electron wavefunctions are located at the surface of the p-Si substrate (12-20) near its interface with gate insulator (10-28).

It should be appreciated that, in the case of nonvolatile memories, the asymmetric coupled quantum well design of FIG. 1(a) and FIG. 1(b) enhances the retention time by increasing the 'effective' separation between the channel charge layer (located in the lower quantum well 15) and the quantum dots 5 without increasing the 'program' voltage for a given gate insulator layer and its thickness.

FIG. 1(c) illustrates an energy band diagram along with the location of carrier wavefunctions for the Si—SiGe asymmetric coupled well transport channel with strained Si wells and SiGe barrier layer realized on a Si substrate. In yet another embodiment, these layers can be realized on a silicon-on-insulator (SOI) configuration using a partially depleted or a fully depleted FET channel design configuration. In addition, other structural arrangements may be used to realize strain in the transport channel.

The details of the coupled well channel of FIG. 1(a) are illustrated in FIG. 1(b). It should be appreciated that in another embodiment, the wells may be realized by Si or SiGe layers and the barriers may be ZnMgS or some other lattice-matched or pseudomorphic layer (such as, but not limited to, ZnMgBeS, ZnMgBeSSe). Here, the use of a pseudomorphic wide energy gap semiconductor or insulator minimizes the surface states at the interface.

Accordingly, the asymmetric coupled well (transport channel) memory structure in conjunction with the incorporation of cladded $SiO_x$—Si dots in the floating gate advantageously solves at least two challenging problems: (a) charge retention; and (b) fluctuation of program-erase characteristics.

In accordance with an additional embodiment, FIG. 2 (a) illustrates a three-state re-channel field-effect transistor (FET) which includes two layers of cladded $SiO_x$—Si quantum dots on InGaAs—InAlAs asymmetric coupled quantum well transport channel realized on lattice-matched gate insulator. In this case, the structure is grown on an InP substrate, but any substrate suitable to the desired end purpose may be used.

As shown in FIG. 2(a), $SiO_x$—Si cladded quantum dots 5 form the floating gate 9 on a p-InGaAs 25 epitaxial layer. The transport channel comprises an asymmetric coupled quantum well (ACQW) transport channel 6, which includes two InGaAs wells (an upper well 21 and a lower well 23) and two barriers layers 22, 24 constructed of p-InAlAs. The barrier layer 22 is deposited between upper well 21 and lower well 23, while barrier layer 24 is deposited on p-InGaAs layer 25 which in turn may be grown on the p-InP substrate 26. The upper InGaAs quantum well 21 has a thin gate insulator 20, which may be selected from a lattice-matched epitaxial layer suitable to the desired end purpose, such as, but not limited to, ZnMgBeSeTe or various other materials or material combinations. Subsequently, a gate semiconductor or metal layer 19 may be grown (or deposited) on floating gate 9 constructed of $SiO_x$—Si cladded quantum dots 5. The gate contact layer 18 is also shown.

It should be appreciated that site-specific self-assembly techniques typically need a p-type substrate for the assembly of $SiO_x$—Si cladded dots. Additionally, $GeO_x$-cladded Ge quantum dots may be used in place of Si quantum dots for various reasons, such as low-temperature processing.

Figure 2B:
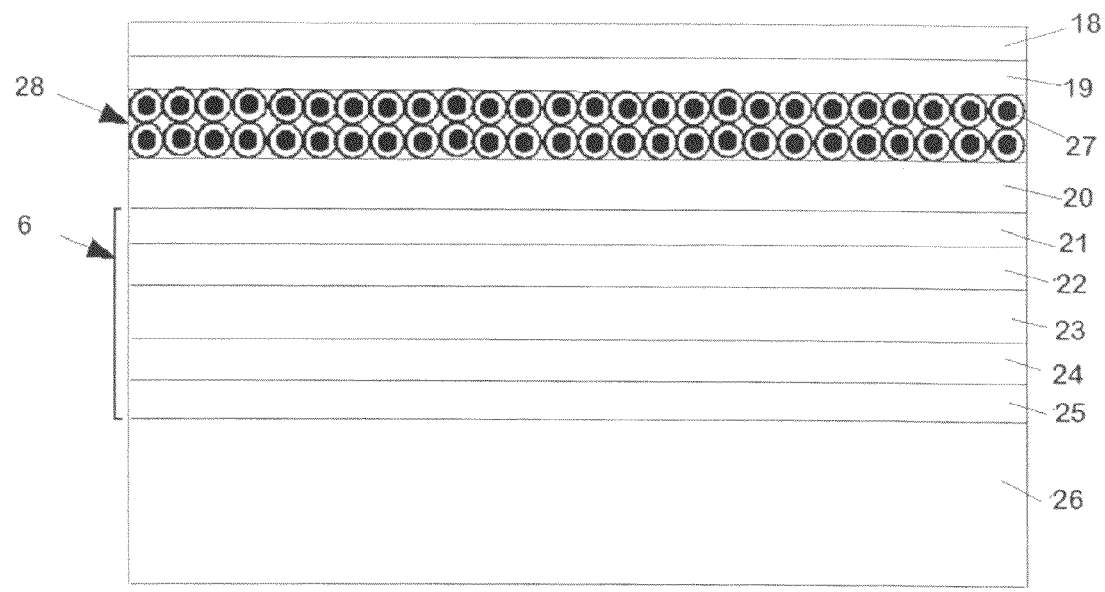

In accordance with still yet another embodiment, FIG. 2(b) illustrates an n-channel 3-state field-effect transistor (FET) similar to that of FIG. 2(a), but that includes ZnCdSe—CdSe cladded quantum dots 27 to form two layers 28 (one or more layers may be used) to serve as the gate region. It should be appreciated that this may be accomplished using any method suitable to the desired end purpose, such as a layer-by-layer self-assembly process. Moreover, it should be appreciated that for a p-channel field-effect transistor (FET), the p-InGaAs layer 25 may be replaced by an n-type InGaAs layer.

It should be appreciated that the asymmetric coupled well (ACQW) channel reduces interfacial scattering and preserves high mobility in the lower well. Additionally, the asymmetric coupled well (ACQW) channel also reduces leakage current to the gate due to increased separation between the channel hosting charge (e.g. well #2) and the floating quantum dot gate 9. Moreover, the asymmetric coupled quantum well (CQW) transport channel, as disclosed in U.S. Pat. No. 6,498,360, the contents of which are incorporated herein by reference in its entirety may be combined with use of a lattice-matched high-band gap (~5 eV) gate insulator (e.g. ZnMgBeSSe) to reduce interface states and improve threshold control variations ($\Delta V_{TH}$)].

Referring to FIG. 3 (a) a cross-sectional schematic of an asymmetric coupled quantum well Si FET (SWS-FET) is shown in accordance with an additional embodiment and illustrates the Spatial Wavefunction Switching (SWS) as a function of gate voltage. In this case, there are no quantum dot layer(s) in the gate region. Rather, the SWS-FET, unlike conventional FETs, has two carrier channels, each of which could be connected by their individual drain and source. FIG. 3(a) illustrates the details of the transport channel. It should be appreciated that although the layers that form the transport channel are similar to the structure as shown in FIG. 1(b), in this case there are no quantum dot layers in the gate region which are typically essential for the operation of nonvolatile memory and 3-state FETs. Another novel and unique distinction over conventional devices is that this device has twin drains and may have two (or more) source regions. Furthermore, the two quantum wells and their barriers may be designed to force wavefunctions into one quantum well or the other, thus providing a selectivity characteristic.

As the gate voltage is increased beyond depletion and approaches the threshold, the wavefunction of carriers are located in the lower Si quantum well W2 15. As the gate voltage is further increased, the carrier wavefunction spatially switches to the upper Si quantum well W1 13. It should be appreciated that this example a type II heterointerface. The thickness of the lower Si quantum Well W2 15 is little bit larger than the upper Si quantum well W1 13. Also, the wavefunction switching from one well to the other depends on various factors, such as barrier and well compositions and thickness. An SiGe barrier layer 14 separates the upper Si quantum well W1 13 from the lower Si quantum well W2 15. An SiGe barrier layer 16 separates the lower Si quantum well W2 15 from a p-semiconductor layer 17, where the layer 17 may be grown on a p-Si substrate 12. The upper Si quantum well W1 13 is in proximity to a gate insulator layer 10, where the gate insulator layer 10 may include a lattice-matched semiconductor, such as ZnMgS and ZnBeMgSSe. The switching voltage may also depend on the properties of the gate insulator 10. Accordingly, the gate insulator layer 10 may have a semiconductor or metal layer 19 which may determine the threshold voltage along with other parameters mentioned above. Table I below illustrates the layer thicknesses used in the simulation shown in FIG. 3(b) and FIG. 3(c). It should be appreciated that the first column refers to the layer material, the bottom row refers to the substrate (Si), the next row above it is the $Si_{0.25}Ge_{0.75}$, above it is a barrier $Si_{0.5}Ge_{0.5}$, then Si well W2, then another barrier $Si_{0.5}Ge_{0.5}$ separating the top Si well W1, then $SiO_2$ gate insulator (top row below the heading). Here the metal gate or poly-Si or poly-SiGe gate and its contacting metal layers are not shown. The second column is the thickness of each layer. Here, the $Si_{0.25}Ge_{0.75}$ layer above Si substrate could be thicker than about ~50 Angstrom or ~0.0050 microns. Generally, this is an unrestrained or relaxed layer. The column labeled Chi refers to electron affinity, Eg refers to the energy gap in electron volts (eV), me the electron effective mass, mh the hole effective mass, □r the dielectric constant, Nd the n-type doping, and NA the p-type doping. Generally, there is a background doping in wells and barriers which is taken to be zero in barriers or other layers.

Figure 3A:
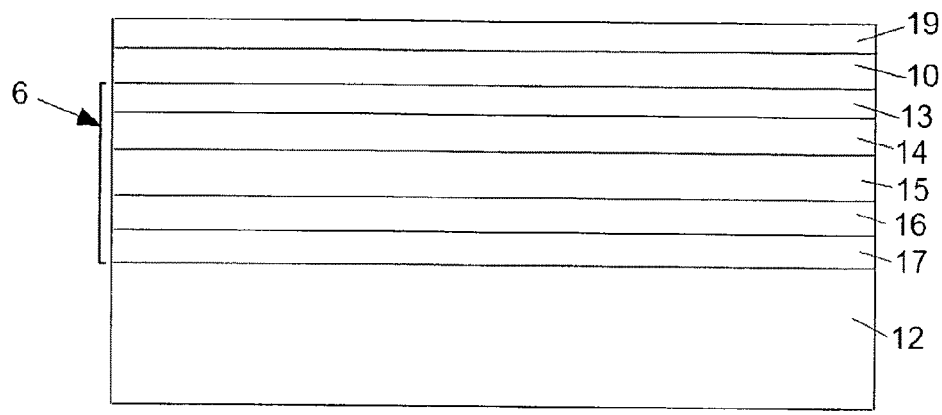
FIG. 3 (*a*) shows a Cross-sectional schematic of an asymmetric coupled well Si FET illustrating Spatial Wavefunction Switching as a function of gate voltage. This FET has one drain and one source each.
Figure 3B:
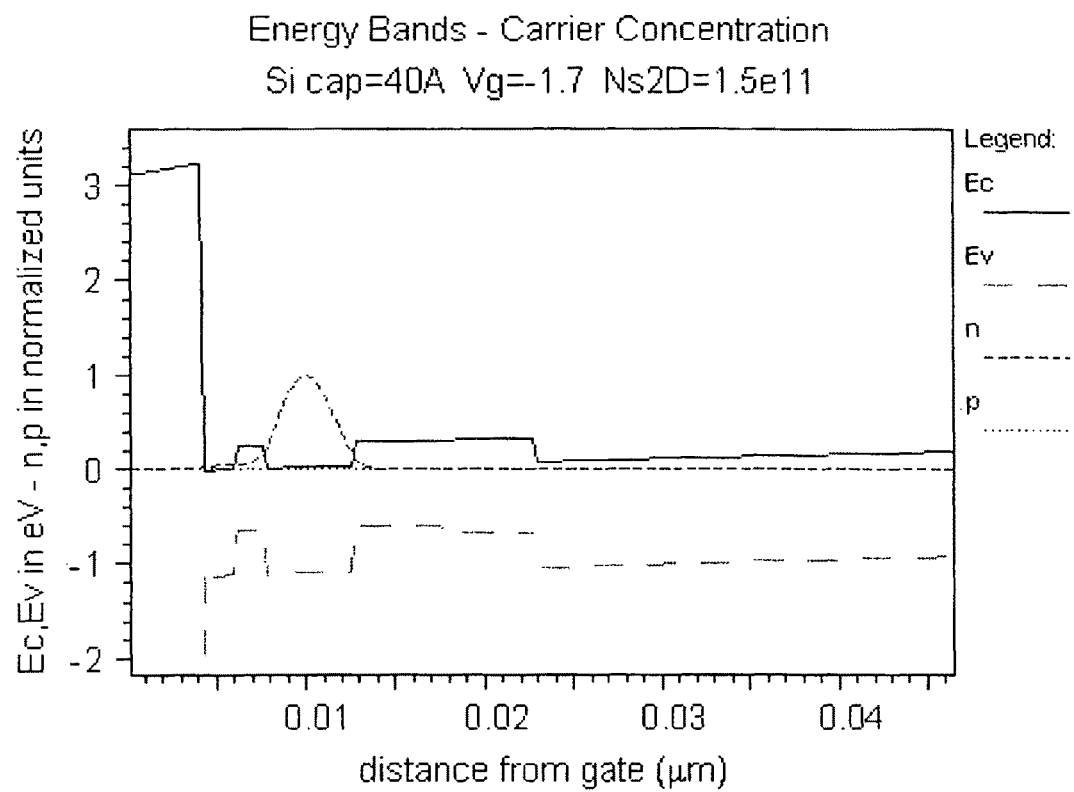
Figure 3C:
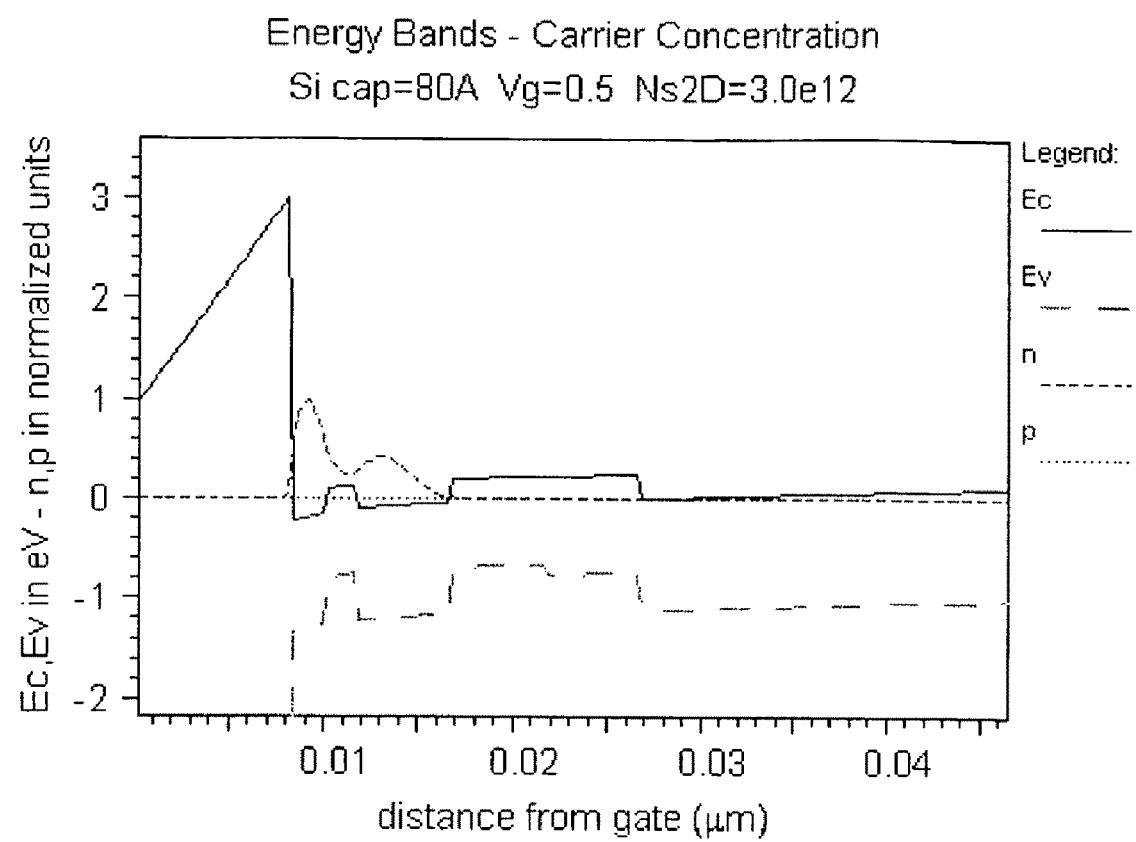

Referring to FIG. 3(b), carriers in the lower Si quantum well W2 15 (dashed line) are shown when the gate voltage is just above the threshold value. In this case a value of 40 Angstrom for the $SiO_2$ gate insulator is used. However, other values may be used as desired and suitable to the desired end result. It should be appreciated that the carrier concentration is the summation of probability (□□) over all of the allowed states populated by carriers (e.g. concentration per unit area is $1.5\times10^{11}$ cm$^2$) in the conduction band (for n-channel devices). It should also be appreciated that Wavefunction (□) may be obtained by self-consistently solving the Schrodinger and Poisson's equations. Referring to FIG. 3(c) carriers primarily switched to the upper Si quantum well W1 13 is shown as the gate voltage is increased, where the gate voltage is shown as being significantly above the threshold value. In this example, the carrier concentration is $3\times10^{12}$ cm$^2$.

It should be appreciated that the current in the transport channel may be given by well known equations found in textbooks on MOS devices. The mobility $\mu_n$ may depend on the channel parameters including, but not limited to, material composition, lattice strain, and surface scattering. The difference between the gate voltage and the threshold voltage ($V_G$-$V_{TH}$) determines the total carrier concentration in the transport channel as well as their location. To some extent gate capacitance per unit area $C_o$ may depend on the charge carrier location in addition to gate insulator thickness. As shown by the equation below, the drain current $I_D$ is at least partially dependent on the channel width Z, its length L, and the drain-source voltage $V_{DS}$.

$$I_D = \left(\frac{Z}{L}\right)C_o\mu_n\left[(V_G - V_{TH})V_{DS} - \frac{V_{DS}^2}{2}\right]$$

Accordingly, the channel current may depend on these factors and a device may be designed taking these parameters into consideration, depending on the intended application for such a device.

Figure 3D:
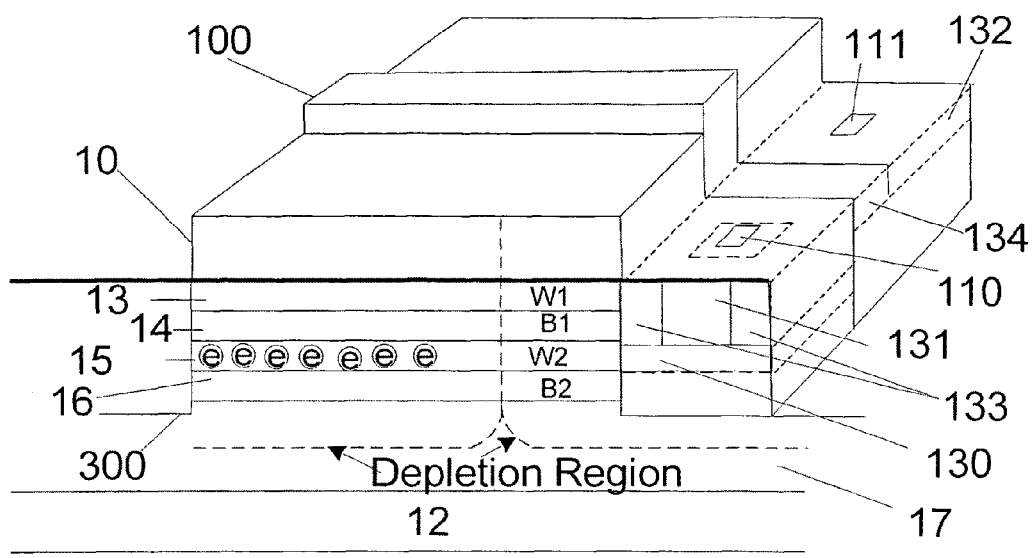

Referring to FIG. 3(d), a three-dimensional schematic block diagram of a Si based SWS-FET is illustrated in accordance with one embodiment of the present invention. In this case, the quantum well and barrier layers are similar to that of FIG. 3(a). The twin drains 110, 111 are shown explicitly. It should be appreciated that the twin drains 110, 111 may be realized using any method suitable to the desired end purpose, such as by etching and regrowth (in one embodiment). For example, one embodiment may include etching of the drain region to the depth of Si Well W2 15 and regrowth of n+ doped Si layer 130, and subsequently depositing SiO2 layer 133 by Plasma Enhanced Chemical Vapor Deposition (PECVD), etching to expose the n+ doped Si layer 130 and depositing either contact layer 110 or regrowing doped region 131 and then contacting 110. For example, the W2 may be contacted by evaporating the contact metal layer or growing a semiconductor region and then forming a metallic contact to the regrown n-type semiconductor. The contact region may connect to lower Si quantum well W2 15 to form Drain D2 110. Similarly, drain contact D1 111 may be formed by using an insulating SiO2 region 134. The gate insulator 10 is also shown, while the gate contact layer is not shown. Here, a thick insulator layer 100 is also shown and may be uniform for one single SWS-FET. It should be appreciated that this layer has relevance to inverter formation using two side-by-side SWS-FETs to be discussed further hereinafter in relation to FIG. 5(e).

Figure 4A:
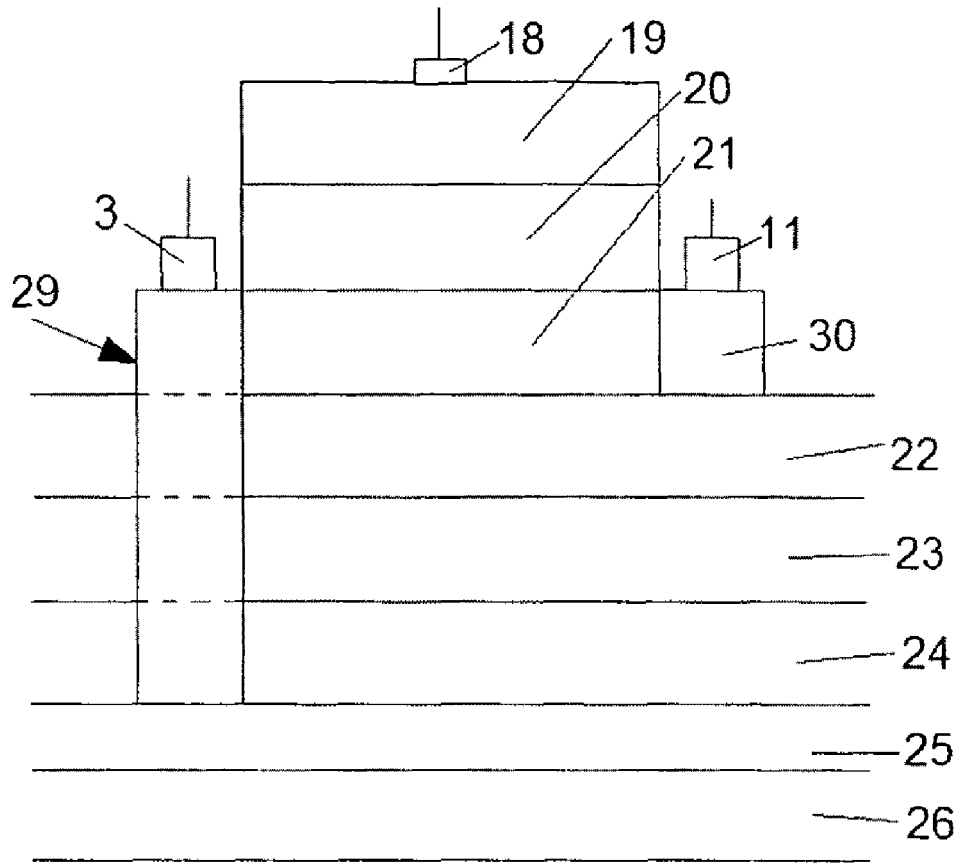
Figure 4B:
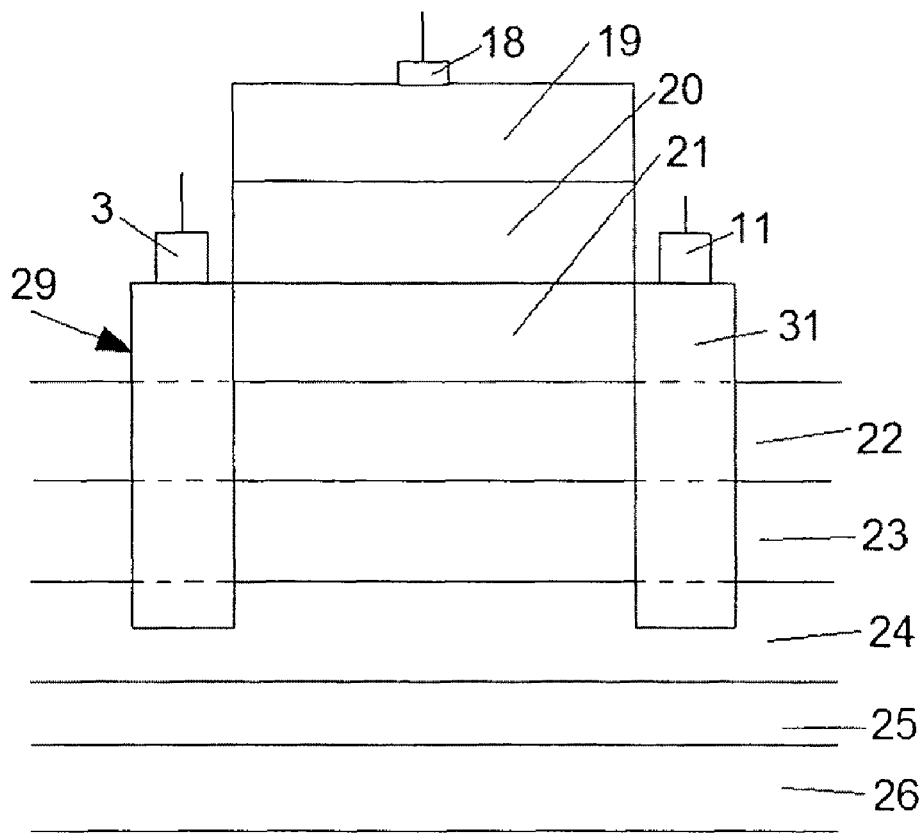
Figure 4C:
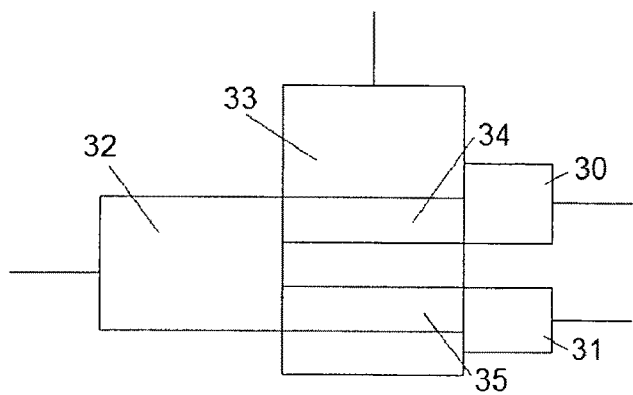
FIG. 4*c* shows an input signal (at the common source) being routed to either Drain 1 or Drain 2 depending on the magnitude of the voltage at the gate. Both drains are independently connected (one from top and the other from bottom side; see FIG. 6).

Referring to FIG. 4(a), a twin-drain n-channel SWS-FET in accordance with another embodiment of the invention is illustrated and includes a InGaAs—InAlAs—InGaAs asymmetric coupled well structure on an InP substrate. It should be appreciated that the drain contact D1 is such that it contacts only the upper well. Referring to FIG. 4(b), a cross sectional schematic diagram illustrating an n-channel twin-drain SWS-FET showing drain contact to Drain 2 (lower well) in accordance with still yet another embodiment of the invention is provided. Referring to FIG. 4(c), an Operational Truth Table for input signal (at the common source) being routed to either Drain 1 or Drain 2 depending on the magnitude of the voltage at the gate is illustrated. It should be appreciated that both drains are independently connected (one from top and the other from bottom side; see also FIG. 9). The Table 0 below shows the spatial routing of the input signal $V_{in}$ (applied to the Source of the SWS-FET).

Referring again to FIG. 4(a), the twin-drain n-channel SWS-FET illustrated using InGaAs—InAlAs—InGaAs asymmetric coupled well transport channel on InP 26 substrate appears similar to the structure described in FIG. 2(a), with the exception that there are no quantum dot layers in the gate region, which are essential for the operation of nonvolatile memory and 3-state FETs. In this structure, the main emphasis is placed on the transfer of charge/wavefunctions from the lower well W2 23 to the upper Well W1 21 and/or vice versa depending on the gate voltage and of course the construction of wells and barriers. The cross-section shown in FIG. 4(a) is of the shallow drain contact D1 30, of the FET, which contacts only the upper well W1 21. The deeper drain D2 cross-section is shown in FIG. 4(b). The two drains are electrically isolated (see FIG. 4(e)) so as to produce two independent electrical characteristics (Id-Vg) from a single device. This is consistent with the result of the Spatial Wavefunction Switching (SWS) effect as discussed hereinabove regarding FIG. 3(a). It should be appreciated that the source region 29 makes contact to the full transport channel, where the transport channel may be an asymmetric coupled quantum well (ACQW) structure, which includes two InGaAs wells (an upper well 21 and a lower well 23) and two barriers (22 and 24). The InAlAs barrier layer (24) may be deposited on a p-InGaAs layer 25 which in turn may be grown on a p-InP substrate 26. The upper InGaAs quantum well W1 21 has a thin gate insulator 20, which could be selected from a lattice-matched epitaxial layer, such as ZnMgBeSeTe 20 or other material or combination of materials suitable to the desired end purpose. Subsequently, a gate semiconductor or metal layer 19 may be grown (or deposited) over the insulator 20. The gate contact layer 18, source 3, and drain 11 electrodes are also shown. It should be appreciated that for a p-channel FET, the p-InGaAs layer 25 may be replaced by an n-type InGaAs layer.

Referring again to FIG. 4(b), the cross sectional schematic of the n-channel twin-drain SWS-FET shows the drain contact D2 31, which makes electrical contact only to the lower well W2 23. In the twin drain configuration, drain contact D2 31 contacts the lowest well of the transport channel, so that if three (or more) quantum wells were present, D2 would contact well 3 W3 (or the lowest well). It should be appreciated that additional drain configurations are also possible. The remaining layers shown in this figure are identical to those of FIG. 4(a).

Referring again to FIG. 4(c), the routing of input signal $V_{in}$, connected at the common source (for both quantum well channels), to either Drain D1 30 or Drain D2 31 depending on the magnitude of the voltage at the gate 33 is shown in accordance with one embodiment. Both drains are shown as being independently connected using (a) one from the top and the other from the bottom side; see also FIG. 9) or (b) the arrangement of FIG. 4(e) where both contacts are from the top side. Also shown are the two independent transport channels 34 and 35, and the source 32, which is common to both.

Referring to Table 0 below, the spatial routing of the input signal (applied to the Source of SWS-FET) is illustrated. In this case, there is no routing of the input signal if the gate voltage is less than $V_{TH}$. If the gate logic level $V_L$, is greater than the threshold $V_{TH1}$ of the FET, then the channel comprising Well W2 has carriers/wavefunctions. Now the current flows out of drain D2 31. However, when the input signal is greater than $V_{TH2}$ then the carriers are transferred to the upper well W1 and the current flows through drain D1 30. It should be appreciated that in some cases, three wells may be used to make the difference in $V_{TH2}$ and $V_{TH1}$ more appreciable.

TABLE 0

Spatial routing of input signal by the control voltage applied at the gate.

| Input signal | Control Gate Voltage Vg | Output at Drain |
|---|---|---|
| Vin (common source) | 1. $V_L > V_{TH1}$ | D2 is ON at terminal 2 (lower well) |
|  | 2. $V_L > V_{TH2}$ | D1 is ON at terminal 1 (upper well) |
|  | 3. $V < V_{TH1}$ | Neither |

Figure 4D:
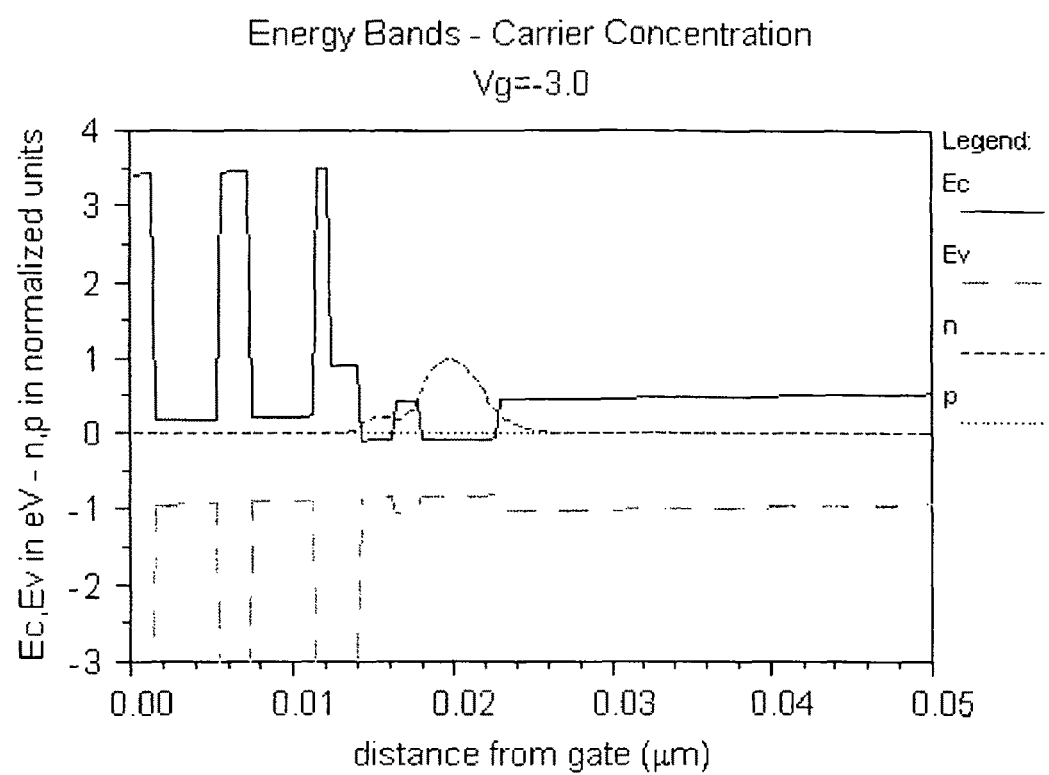
FIG. 4*d*(*i*) shows an InGaAs based ACQW device with QD gate showing carriers in lower well.

Referring to FIG. 4d (i) illustrates a plot of the energy band-carrier concentration is illustrated for an InGaAs based ACQW device with a quantum dot (QD) gate having carriers in the lower well W2. The purpose of this figure is to show the electron wavefunction in the ACQW at a particular gate voltage. Additionally, FIG. 4d(ii) illustrates a plot of an InGaAs based ACQW device with a quantum dot (QD) gate having carriers in the upper well W1.

FIG. 4d (i) taken in combination with FIG. 4d(ii) illustrates that the gate voltage controls the shape of the wavefunction in the coupled well channel, and thus the position of the peak carrier density. This peak appears in the upper well W1 or the lower well W2 at different voltages, giving rise to different electrical characteristics at each drain (D1, D2). It should be appreciated that this behavior is present in the ACQW regardless of the presence of QD layers. Additionally, FIG. 4d(ii) taken in combination with FIG. 4d(i) demonstrates the sensitivity of the electron wavefunction, and thus the location of the charge in the transport channel, to the applied gate voltage.

Figure 4E:
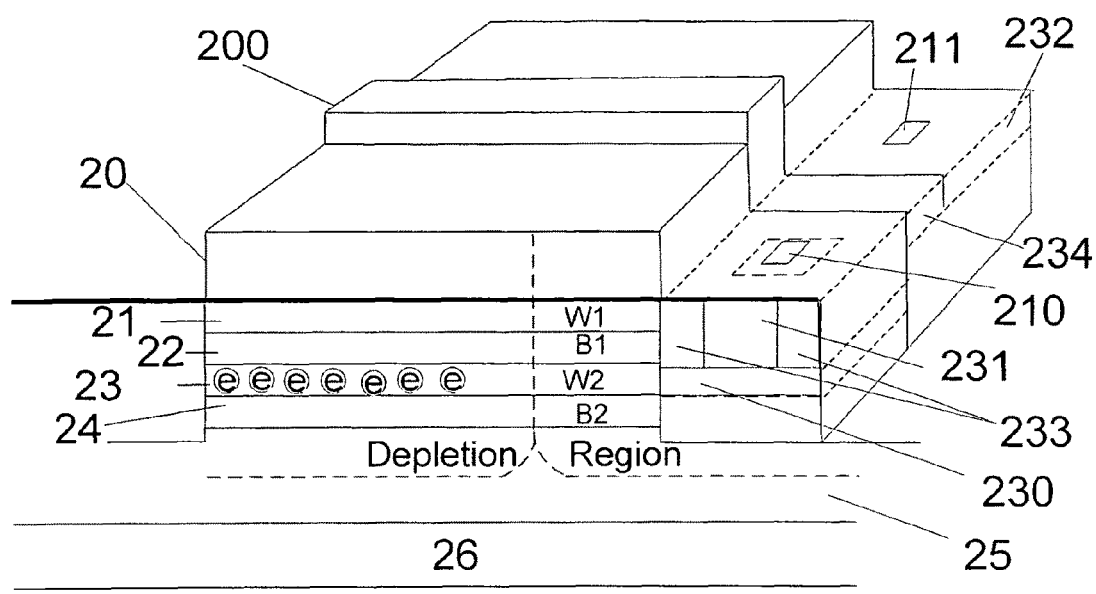

FIG. 4(e) illustrates a three-dimensional InGaAs based ACQW device with two drain connections (with no quantum dots (QDs) in the gate region). This SWS-FET device has two drain regions shown explicitly in terms of an embodiment which can be implemented having InGaAs (wells) and InAlAs barriers. Here the quantum well and barrier layers are similar to that of FIG. 4(a). The twin drains, which are shown explicitly, may be realized using any technique suitable to the desired end purpose, such as by etching and regrowth (in one embodiment). For example, one embodiment may include etching of the drain region to the depth of the InGaAs Well W2 23 and regrowth of the n+ doped InGaAs layer 230, and subsequently depositing a SiO2 layer 233 by PECVD (or some other technique), etching to expose the surface of layer 230 and depositing either contact layer 210 or re-growing doped region 231 and forming an Ohmic contact 210 serving as drain D2. The contact region may connect to the InGaAs quantum well W2 23 to form Drain D2 210. Similarly, the drain contact D1 211 may be formed by using a insulating SiO2 region 234. The gate insulator 20 [which is depicted as II-VI layer like ZnBeMgSeTe or some other suitable lattice-matched wide energy gap semiconductors] is also shown, however the gate contact layer is not shown. Here, a thick insulator 200 is also shown. Generally, this layer may be uniform in thickness for a single SWS-FET and has relevance to inverter formation using two side-by-side SWS-FETs to be discussed hereinafter in relation to FIG. 5(e). It should be appreciated that in InGaAs devices, the SiO2 insulators such as 234 and 233 could also be implemented by the use of undoped II-VI layers that are used for gate insulator 20.

Figure 5A:
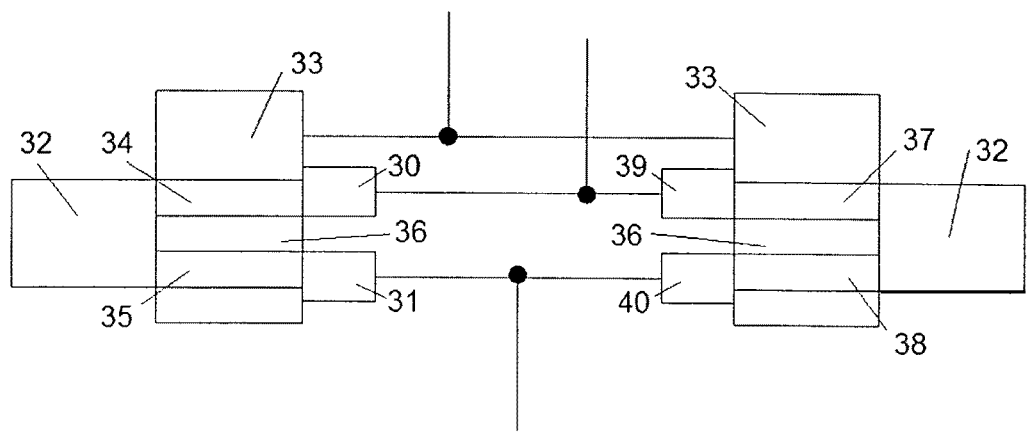
FIG. 5(a) shows a topology of a CMOS like logic device using twin-drain n- and p-channel SWS-FETs.

Referring to FIG. 5(a), a schematic block diagram illustrating the topology of a CMOS like logic device in accordance with an additional embodiment of the present invention is shown, where the CMOS like logic device includes twin-drain n- and p-channel SWS-FETs. This figure illustrates only one of the schemes for connecting two drains 30, 31 of the n-channel devices 34, 35 and two drains 39, 40 of the p-channel 37, 38 devices in a complementary metal oxide semiconductor (CMOS) configuration. In this embodiment, the regions between the two channels 34, 35 in the n-type device (left), and 37, 38 in the p-type device (right) are distinguished by a thicker gate insulator layer 36 [see FIG. 5(e) as an example of a thicker insulator used to separate two channels or devices]. It should be appreciated that for a given gate voltage, the region under the thicker gate insulator will not get an inversion layer, causing the two adjacent transport channels to be electrically isolated. Also shown schematically, are the gate contact 33 and source contact 32.

Figure 9:
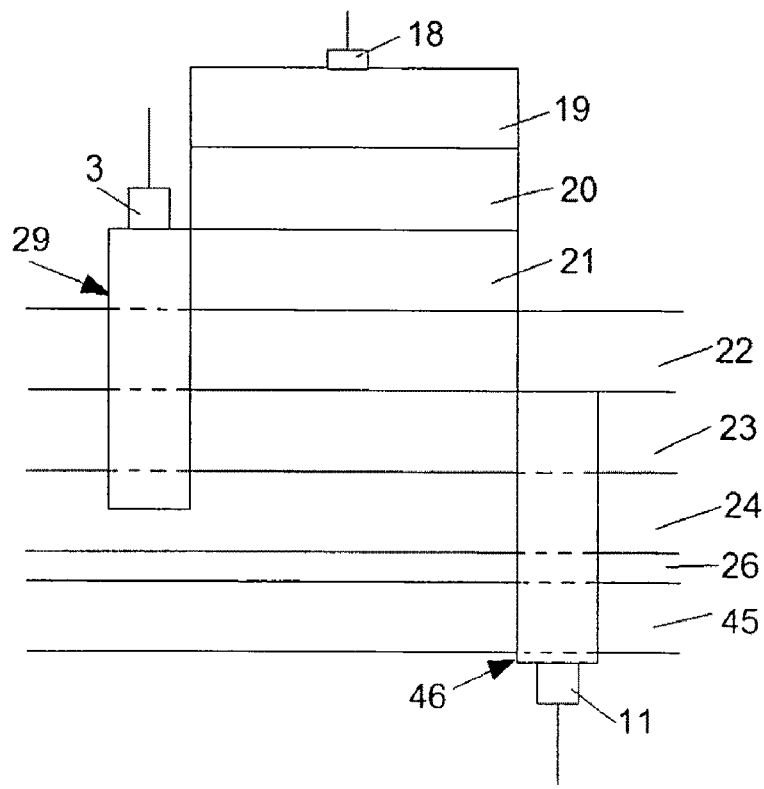

In accordance with still yet another embodiment, an alternate scheme may be implemented without the use of a thicker gate insulator in the region separating the two channels. This alternate approach depends on the conductivity or sheet resistance of the inversion channel formed when a gate voltage greater than the threshold is applied. This scheme will work when the two drains are individually connected to only one of the two wells in a SWS-FET (such as shown in FIG. 9).

Figure 5B:
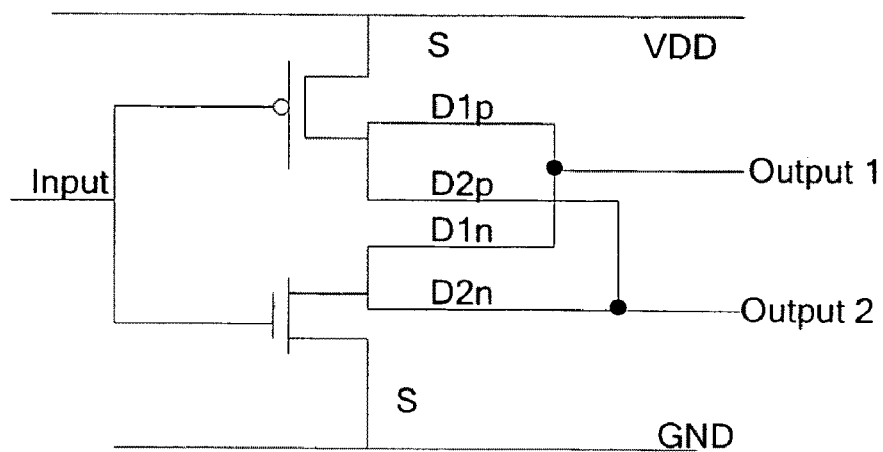
FIG. 5(b) shows a circuit schematic of a CMOS like inverter using n- and p-channel twin-drain SWS-FETs.

Referring to FIG. 5(b), a circuit schematic of a CMOS like inverter using n-channel and p-channel twin-drain SWS-FETs is illustrated in accordance with still yet another embodiment of the invention. Here, the drain D1 of one FET is connected to the drain D1 of the other FET. Similarly, the drains D2 are connected together. An alternate scheme includes connecting the D2p drain (i.e. lower well) of the p-channel FET with the D1n drain (i.e. upper well) of the n-channel FET. Similarly, D2n may be connected to D1p.

Figure 5C:
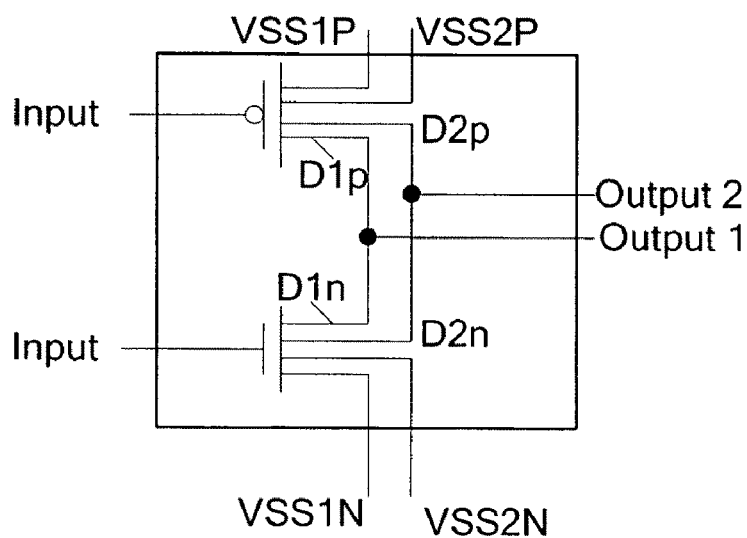
FIG. 5(c) shows twin drain and twin source configuration.

FIG. 5(c) illustrates another embodiment of a twin drain and twin source configuration. In this version, twin sources are present in addition to the twin drains of other versions. This enables the connection of multiple supply voltages (Vss1p, Vss2p, Vss1n, and Vss2n). In such a configuration, each Vss level will appear at one of the outputs (output 1, output 2), depending on the combination of voltages present at the inputs (input 1, input 2). In this way, multilevel logic circuits may be constructed from SWS'FETs.

Figure 5D:
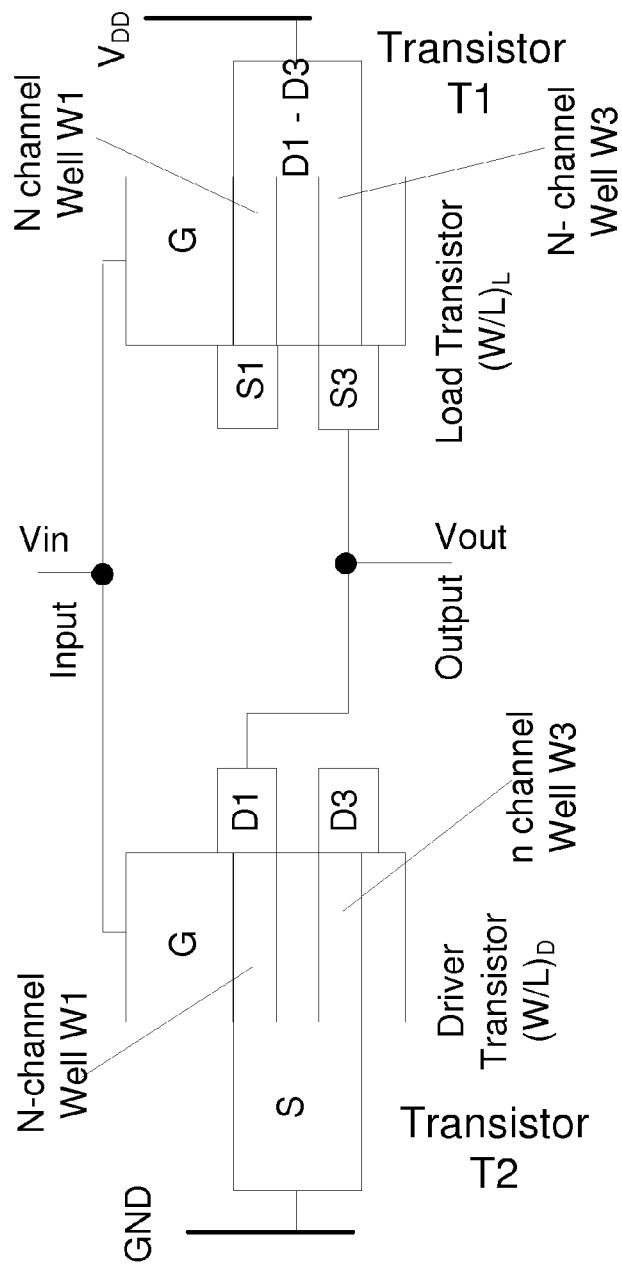
FIG. 5(d) shows a circuit schematic of a CMOS like inverter using two n-channel twin-drain SWS-FETs.

FIG. 5(d) illustrates a circuit schematic diagram of a CMOS like inverter using two n-channel SWS-FETs, one twin-drain SWS-FET (T2) and one twin-source SWS FET (T1). In this version, only n-channel SWS FETs are present, no p-channel. The source S3 (which contacts well 3, W3) of transistor T1 is connected to the D1 drain (which contacts well 1, W1) of transistor T2. It should be appreciated that both D3 of T2 and S1 of T1 are left unconnected (floating). Utilizing a different channel (drain) of each transistor essentially selects the threshold of that device. This is necessary since the thresholds of each device must be different in order for the circuit to function. Additional threshold control is achieved by using different thicknesses for the gate oxide (insulator) layer in each device. Furthermore, the Z/L (width/length) ratio may be changed in each device to tailor its output (id) level, as needed. The importance of this configuration is its potential for high speed operations.

Figure 5E:
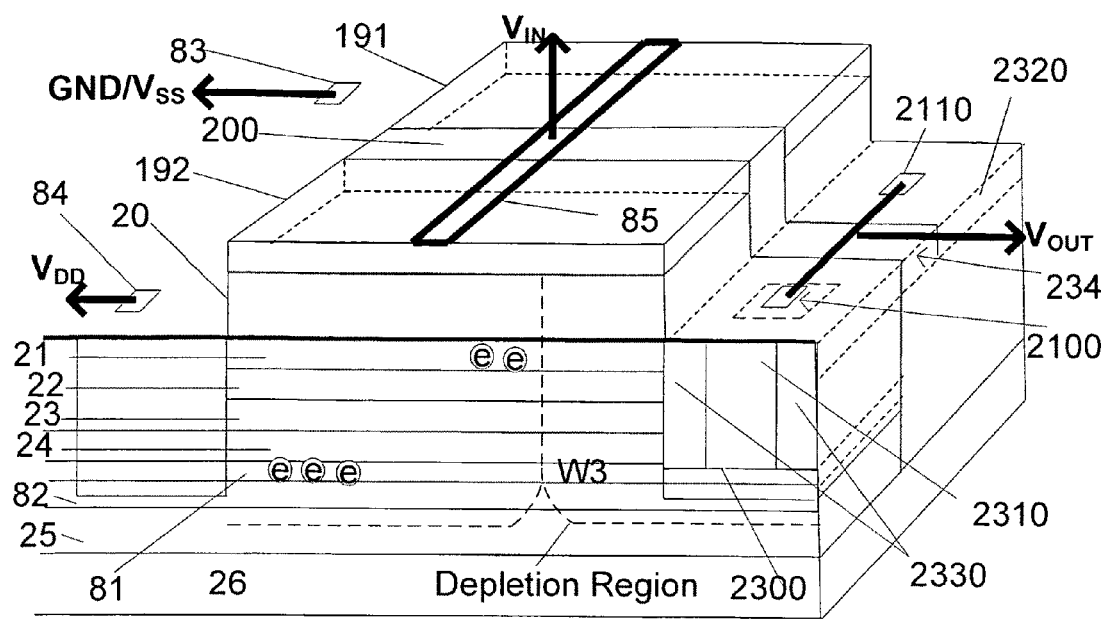
FIG. 5(e) shows a 3-dimensional version of two n-channel inverter.
Figure 5F:
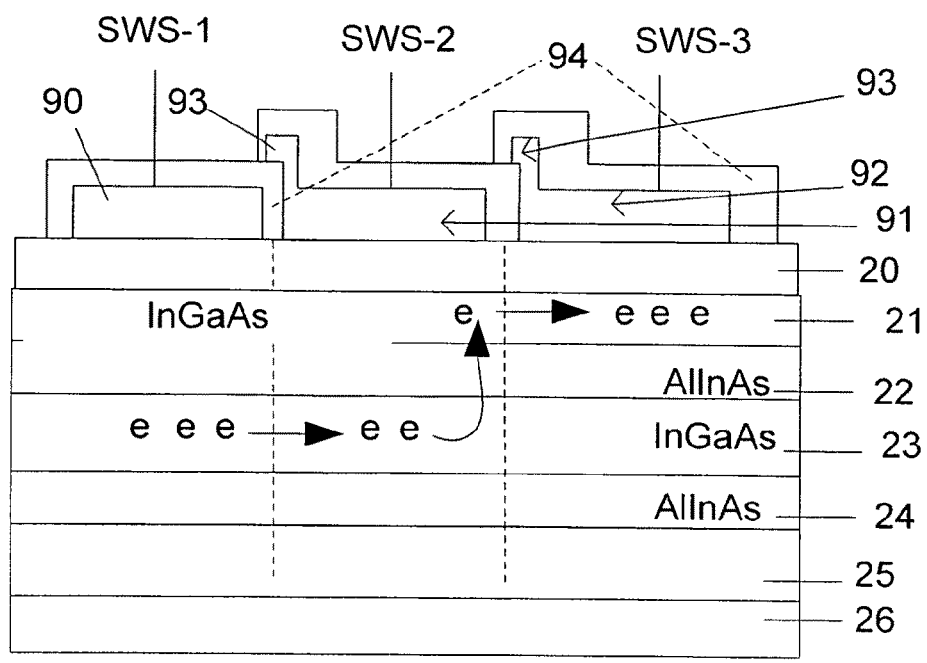
FIG. 5(f) Lateral and vertical transfer of charge from device SWS-1 to SWS-3.

Referring to FIG. 5(e), a 3-dimensional version of two n-channel SWS-FETs configured as a CMOS like inverter in accordance with still yet another embodiment is illustrated. Here the transport channel includes three InGaAs wells 21, 23, 81 and three barriers 22, 24, 82. The drain D1 2110 (of SWS FET T2) connects to well W1 21 and source 2100 connects to well W3 81 (of SWS FET T1). This is similar to that of FIG. 4(e), with the difference being that this configuration has three wells and the middle well W2 23 is not contacted. It should be appreciated that the twin drains or twin sources (FIG. 5d SWS FET T1) may be realized using any method suitable to the desired end purpose, such as by etching and regrowth. For example, etching of the drain region to the depth of InGaAs Well W3 81 and regrowth of a n+ doped InGaAs layer 2300, and subsequently depositing a SiO2 layer by PECVD 2330 (or some other suitable method), etching to expose the surface of the n+ doped InGaAs layer 2300 and depositing either contact layer 2100 or re-growing doped region 2310 and forming an Ohmic contact 2100 serving as source S3 (for SWS FET T1). Similarly, the drain contact D1 2110 may be formed by using insulating SiO2 region 234. The gate insulator 20 [which is depicted as II-VI layer like ZnBeMgSeTe or some other suitable lattice-matched wide energy gap semiconductors] is also shown. It should be appreciated that gate layers 192 and 191 are for two SWS-FETs, respectively. The gate could be metal or semiconductor (in case of semiconductor, there may be a gate contact for each). Here, a thick insulator 200 divides the two FETs from each other. Moreover, in the case of InGaAs devices, the SiO2 insulators such as 234 and 233 could also be implemented by using undoped II-VI layers that are used for gate insulator 20. The source contact is shown for T2 83 and drain contact for T1 84 and the two gates are symbolically shown connected by a thin interconnect 85 (connecting the Ohmic contacts for each of the two gates, not shown explicitly). Similarly, the drain 2110 (D1 of SWS FET T2) and source S3 (SWS FET T1) 2100 are connected and in turn link to $V_{out}$ of the inverter. The source 83 (SWS FET T2) and drain 84 (SWS FET T1) are connected to ground (GND) or VSS (supply bias) and VDD supply, respectively. Note that FIG. 5(d) refers to drain D3 and drain D1 which are formed on Well W3 81 and well W1 21, respectively (for SWS FET T2), and source S3 and S1 (for SWS FET T1) are formed in Well W3 and Well W1, respectively. However, in FIG. 5e, drain D3 is treated as Drain D2 (for SWS FET T2) as there are only two drains. Three separate drains could also be realized.

In accordance with the invention, another feature of the SWS structure is illustrated in FIG. 5(f) which shows a lateral and vertical transfer of charge from SWS-1 to SWS-3. Here the lateral transfer of charge from one SWS device to another is accomplished in a manner similar to that of charge coupled devices. Here, the gate voltage of device SWS-2 is increased with respect to SWS-1. This results in creating a higher demand of charges in the channel which has a greater demand or greater gate potential. The charge coupling requires the gates of the two adjacent SWS devices to be closer to each other. Here we show three SWS devices: SWS-1, SWS-2, and SWS-3. Each of these SWS devices has two InGaAs quantum wells 21 and 23 and two barriers 22 and 24. The transport channel which includes wells and barriers may be realized on a p-InGaAs layer 25 which in turn is on a substrate 26. It should be appreciated that although substrate 26 is shown as a p-InP substrate or a semi-insulating substrate, any substrate suitable to the desired end purpose may be used. The gates 90, 91, 92 of the three SWS devices SWS-1, SWS-2, SWS-3 are separated by an insulator 94. The gate regions are configured to overlap 93 over the separation between each of the devices SWS-1, SWS-2, SWS-3. This overlap facilitates the charge transfer between the SWS devices. The charge can be transferred laterally in a well (say well W2) from one device (SWS-1) to another adjacent device SWS-2 by the application of a suitable gate voltage. Vertical transfer of charge in SWS structures have been described elsewhere in this application. Note that here the drain regions and the source regions are not shown. The terminal SWS structures may be equipped with twin drains if a specific application requires. Moreover, charge generation can be accomplished using any method suitable to the desired end purpose.

Figure 6:
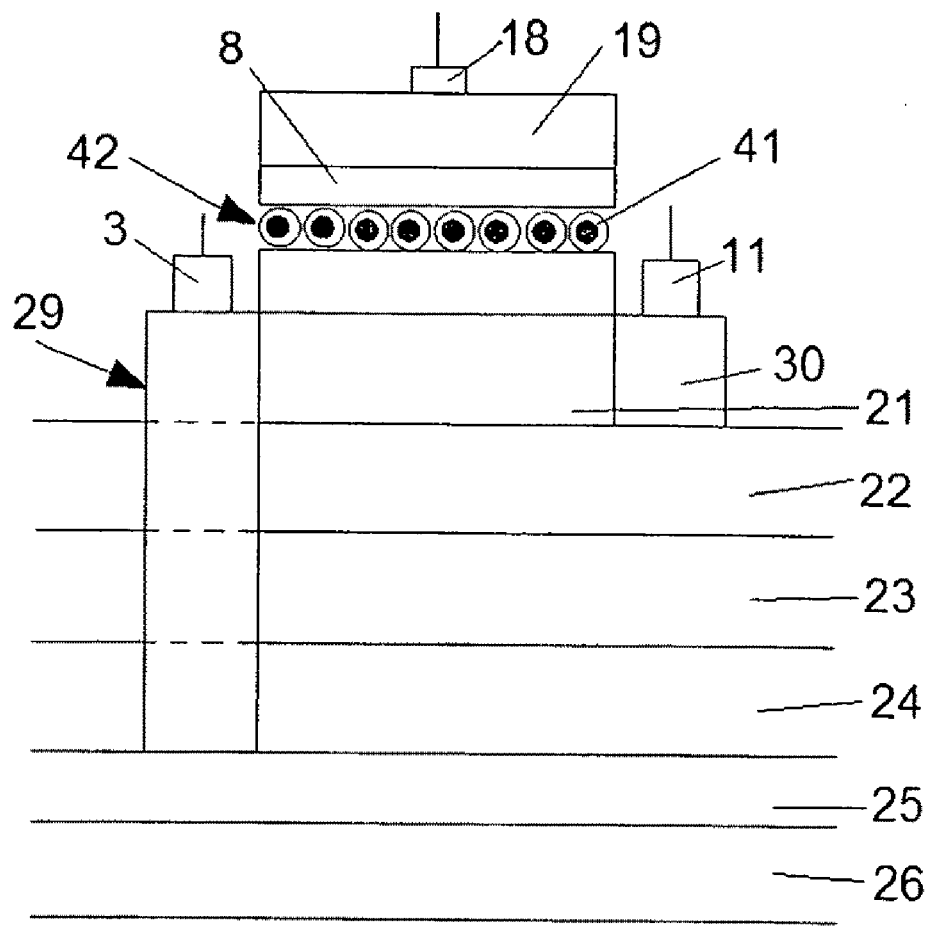
FIG. 6 shows a channel (identified as drain 1) of twin-drain SWS-FET with floating $GeO_x$—Ge quantum dot gate configured as a nonvolatile memory.

Referring to FIG. 6 illustrates one channel (identified as drain 1 (upper well)) 30 of a twin-drain SWS-FET having a floating GeO$_x$—Ge quantum dot gate configured as a non-volatile memory in accordance with still yet another embodiment of the invention. As shown, a quantum dot (QD) gate feature is incorporated in one of the channels (D1) 30 contacting the upper quantum well 21. It should be appreciated that the electrical resistance of the contact to Drain 1 can be reduced by growing epitaxially a n+ layer (of InGaAs or other suitable compatible material(s)) over the contact region. This drain and source extension(s) may significantly improve the FET performance. This contact structure is similar to that described in FIG. 4(a) and the gate structure is similar to that of FIG. 2(a). Here, GeO$_x$—Ge quantum dots 41 are used instead of SiO$_x$—Si quantum dots, to form the floating gate layer 42. As before, the source region 29 makes contact to the full transport channel, while the shallow drain, D1 30, only connects to the upper quantum well, W1 21. The transport channel may be an asymmetric coupled quantum well (ACQW) structure, which includes two (or more) InGaAs wells (i.e. upper well 21, lower well 23) and two barriers (22 and 24). The InAlAs barrier layer 24 is deposited on a p-InGaAs layer 25 which in turn may be grown on the p-InP substrate 26. The upper InGaAs quantum well 21 may have a thin gate insulator 20. Subsequently, a gate semiconductor or metal layer 19 may be grown (or deposited) over the insulator #2 8 that also may be grown on top of the quantum dot layer 42. The gate contact layer 18, source 3, and drain 11 electrodes are also shown. It should be appreciated that for a p-channel FET, the p-InGaAs layer 25 may be replaced by an n-type InGaAs layer.

Although FIG. 6 shows an InGaAs FET using a gate insulator #1 20, this insulator may be any type of insulator suitable to the desired end purpose. For example, a lattice-matched insulator such as ZnBeMgSeTe, ZnMgSeTe, and others as described in U.S. patent application Ser. No. 12/006,974 filed Jan. 9, 2008, the contents of which are incorporated herein by reference in its entirety. Moreover, the cladded Ge quantum dots 41 may be self-assembled using any technique suitable to the desired end purpose, such as described in U.S. Pat. No. 7,368,370 to Jain, et al, the contents of which are incorporated herein it its entirety. It should be appreciated that these dots form the floating gate of the nonvolatile memory device. The deposition of gate insulator #2 may be optional in the case where the cladding of the quantum dots (QDs) is thick enough.

It should be appreciate that other embodiments may include the configuration where one of the channels has quantum dots and the other channel is conventional without a quantum dots (QD) based floating gate. This device presents greater design flexibility and it may serve as a multi-bit storage device or a device that can assist in spatial routing (see FIG. 10). Again, similar schemes may be used for Si based devices using SiOx-Si quantum dots (QDs).

Figure 7:
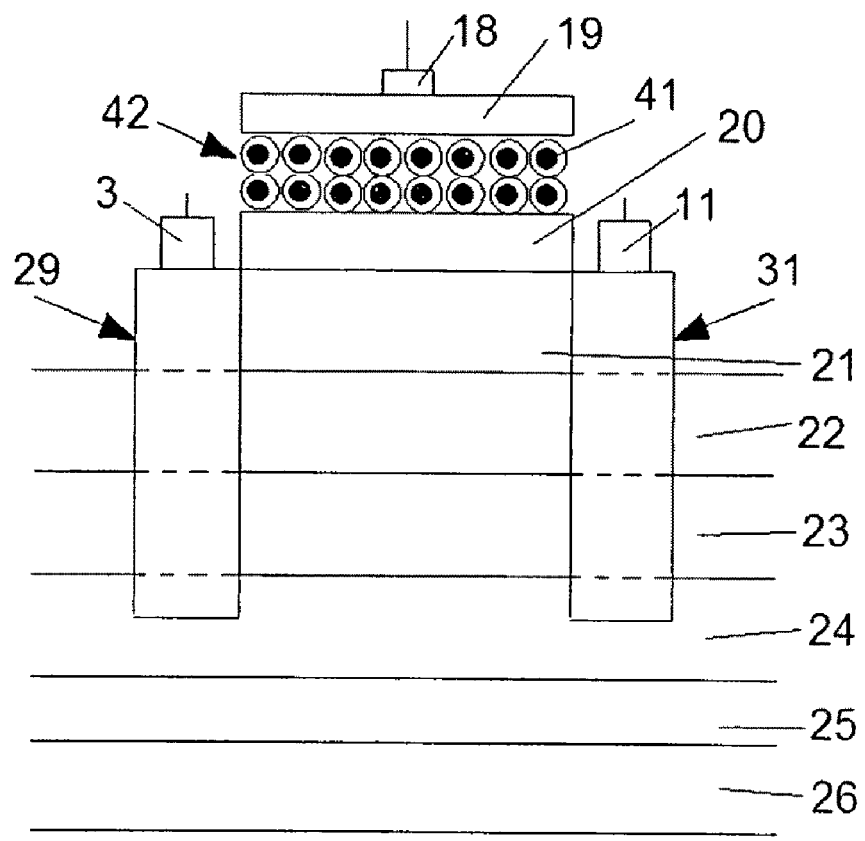
FIG. 7 shows a channel (identified as drain 2) of twin-drain SWS structure with two-layers of $GeO_x$-cladded Ge quantum dot gate configured as a 3-state FET device.

Referring to FIG. 7, still yet another embodiment is provided where one channel (identified as drain D2) 31 of a twin-drain SWS structure with two-layers 42 of GeOx-cladded Ge quantum dots 41 gate is configured as a 3-state FET device. Here, the cross-sectional schematic of a 3-state device is configured for the twin-drain SWS-FET considering only the channel connecting drain D2 31. This is the front contact version. A similar procedure may be used for individually connected quantum wells of FIG. 9. Moreover, it may be added that 3-state FETs have a pair of cladded quantum dots with no intentional gate insulator #2 8 as shown in FIG. 6. Otherwise, the layer and contact structure are identical to those of FIG. 6.

Figure 8:
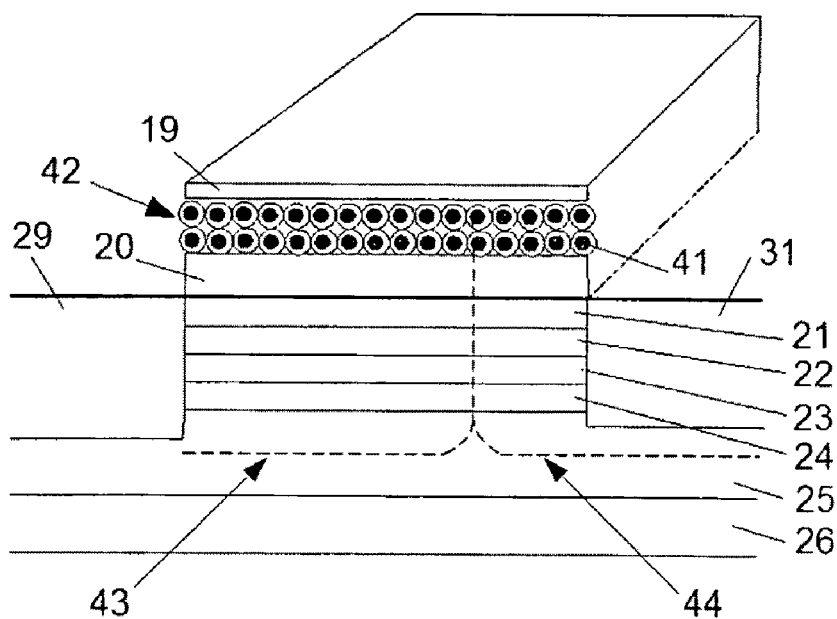
FIG. 8 shows a Spatial Wavefunction Switching (SWS) QD-gate QD-channel.

Referring to FIG. 8, still yet another embodiment of the invention is provided. As shown, a Spatial Wavefunction Switching (SWS) QD-gate Quantum Dot-channel FET is illustrated and includes a channel length L and width Z that are small enough to manifest quantum confinement effects. In the case of channel lengths higher than and/or about 12 nm, the depletion 44 near the drain end, when VDS>VDS (saturation), will reduce it to less than 12 nm (in the range of 10 nm or smaller) to quantize the channel 43 in all three dimensions. (For example, the effective channel length reduces below the mask designed dimension L of the gate when the drain voltage $V_{DS}$ is above the saturation value $V_{DS}$(sat).) This will give novel I-V switching characteristics and temperature behavior. In this figure we have both source 29 and drain 31 regions showing contact to both the wells, W1 21 and W2 23. A quantum dot (QD) gate 42 including GeOx-Ge Quantum dots 41, can be incorporated in the twin-drain SWS FET structure. Although we are showing the InGaAs based device with InGaAs wells (i.e. upper well W1 21 and lower well W2 23), InAlAs barriers 22, 24, and II-VI lattice-matched gate insulator 20, it is contemplated that similar structures using SiGe—Si and/or other material systems may be implemented. The remaining layers are p-InGaAs layer 25 which in turn may be grown on the p-InP substrate 26. A gate semiconductor or metal layer 19 is also shown, although the metallic electrode is not. Thus a 12 nm channel becomes 10 nm or smaller.

Referring to FIG. 9, another embodiment of the invention involves Drain 2 of TD-SWSFET being contacted from the back side. Now the channel connected via drain D1 (not shown) will not be connected when the channel connected to drain D2 (46) is ON. The remaining portions of the structure are identical to those in FIG. 4(b). The source region 29 makes contact to the full transport channel, where the transport channel may include two InGaAs wells (i.e. an upper well W1 21 and a lower well W2 23) and two barriers (22 and 24). The InAlAs barrier layer 24 may be deposited on a p-InGaAs layer 25 which in turn may be grown on the p-InP substrate 26. The upper InGaAs quantum well 21 may have a thin gate insulator 20. Subsequently, a gate semiconductor or metal layer 19 may be grown (or deposited) over the insulator 20. The gate contact layer 18, source 3, and drain 11 electrodes are also shown. It should be appreciated that the contact to lower well W2 23 may be realized in other ways suitable to the desired end purpose. This scheme is natural to three-dimensional integrated circuit implementation.

Figure 10:
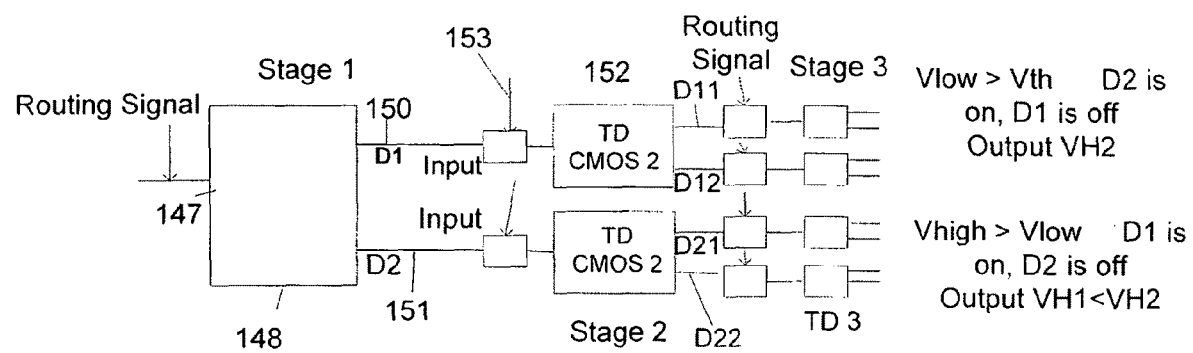
FIG. 10 shows a Spatial routing of signals using twin-drain TD-SWSFET CMOS inverters along with conventional routing logic. Here, both drains (D1 and D2) front contacted as shown in FIG. 4).

Referring to FIG. 10 another embodiment of the invention involves spatial routing of signals using twin-drain TD-SWS-FET CMOS inverters along with conventional routing logic. Here, both drains (D1 and D2) are front contacted as shown in FIG. 4. This figure shows routing of an Input A to one of the eight output paths after 3-stage cascading of Twin-Drain SWS-FET CMOS inverter circuits. Stage #1 may select the Out 1 or Out 2 depending on the gate voltage. The Input A is transmitted to TD CMOS stage #2, where an interface circuit block is shown at each of the two Outputs. These may or may not be needed to shape the voltage level depending on the application. In addition, they get, routing instructions to shape the voltage levels. This along with the gate voltages applied to TD-CMOS 2 may be used to decide where the Input A is connected to (e.g. D11 or D22 etc.). It is contemplated that when using individually drain connected TD structures (See FIG. 9), the routing may be implemented differently as desire It should be appreciated that as disclosed herein a field-effect transistor is provided that includes source, gate and drain regions, where the gate region controls the charge carrier location in the transport channel. The transport channel may include a asymmetric coupled quantum well layer, where the asymmetric quantum well layer may include at least two quantum wells of different thickness, separated by a barrier layer having a greater energy gap than the quantum wells. The transport channel may be connected to the source region at one end, and the drain regions at the other end, where the drain regions may include at least two contacts electrically isolated from each other, where the contacts are connected to at least one quantum well. In one embodiment, the drain may include two regions, where one of the drain regions may connect to the lower of the two quantum wells forming the asymmetric coupled well transport channel, the other drain region may connect to the upper well. In still another embodiment, the drain may include two regions, where one of the drain regions may connect to the lower of the two quantum wells forming the asymmetric coupled well transport channel, while the other drain region may connect to both wells.

Furthermore, in accordance with the invention a field-effect transistor nonvolatile memory device is disclosed herein, where the device includes source, gate and drain regions. The gate region controls charge carrier location in the transport channel, where the transport channel includes a asymmetric coupled quantum well layer. The asymmetric quantum well layer may include at least two quantum wells of different thickness, separated by a barrier layer having a greater energy gap than the quantum wells, where the transport channel is connected to the source region at one end, and the drain regions at the other. The drain regions include at least two contacts electrically isolated from each other, where the contacts are connected to at least one quantum well.

In accordance with the invention, the gate region may include a multilayer structure, a first thin insulator and/or a wide energy gap lattice-matched semiconductor layer of about 10-100Å in thickness, where the first thin insulator layer may be adjacent the semiconductor region hosting the transport channel between the source and drain regions. The first thin insulator layer may have at least one layer of cladded quantum dots deposited on it, where the cladded quantum dots may include a core with an outer cladding layer. The cladding may include a wide energy gap semiconductor and/or high energy gap insulator which may include GeOx, $SiO_x$ and/or any other material suitable to the desired end result. The core may include a lower energy gap semiconductor including (but not limited to) Si, Ge, InGaAs, GaAs and/or any other material suitable to the desired end result. The core may be about 3-10 nm and the cladding may be about 1-5 nm. Moreover, the cladded quantum dot layer may have a second thin insulator layer deposited on top of it, where the second thin insulator may have an additional layer forming the control gate.

The control gate may include a poly-Si, poly-SiGe, or another suitable semiconductor material and/or metal layer, where the gate material provides the desired work function that results in the operating flat band and threshold voltages for the FET device. The semiconductor region under the first insulator layer may include an asymmetric coupled quantum well structure, where the coupled well structure may be a strained layer structure to obtain high carrier mobility channel and the strain in the coupled well structure may be obtained by depositing an unstrained layer of SiGe layer of appropriate composition and thickness to result in strain in the Si well #2. The unstrained SiGe layer may be grown on a Si or Si-on-insulator substrate, where the 'Write' state of the nonvolatile memory is achieved by changing the charge trapped on the cladded quantum dots forming the floating gate on at least one of the two channels. The charge may be adjusted by manipulating the source-drain, and the gate voltages. In one embodiment the source-drain voltage may be pulsed in order to transfer hot carriers from the transport channel region near one of the two drain ends. In another embodiment, the charge on the dots may be transferred from the inversion channel by adjusting the gate voltage.

Additionally, a 3-state field-effect transistor device is provided and includes source, gate and drain regions, where the gate region controls the charge carrier location in the transport channel. The transport channel includes a asymmetric coupled quantum well layer, where the asymmetric quantum well layer includes at least two quantum wells of different thickness, separated by a barrier layer having greater energy gap than the quantum wells. The transport channel may be connected to the source regions at one end, and the drain regions at the other, where the drain regions include at least two contacts electrically isolated from each other. The contacts may be connected to at least one quantum well. The gate region may include a multilayer structure, a first thin insulator, about 10-100Å in thickness, including an insulator such as $SiO_2$, or a wide energy gap lattice-matched semiconductor layer which may include ZnMgS and/or ZnBeMgSSe, where the first thin insulator layer is deposited on top of a semiconductor region hosting a transport channel region between the source and drain regions. Additionally, the first thin insulator layer may have at least two layers of cladded quantum dots deposited on it, where the top surface of the cladded quantum dot layers may have a semiconductor layer or metal layer serving as the gate. The layers including cladded quantum dots may include $SiO_x$-cladded Si, GeOx-Ge nanocrystals and/or any other material suitable to the desired end result.

In the three-state FET in which the transport channel includes InGaAs—InAlAs coupled quantum wells, the quantum wells are grown on InGaAs—InP epitaxial substrate appropriately doped to facilitate inversion of the n-channel and p-channel FETs, where the transport channel region has a thin layer of lattice-matched ZnMgBeSeTe wide energy gap semiconductor, the insulator hosting on top of its surface at least two layers of cladded quantum dots such as $SiO_x$—Si, ZnS—CdSe, ZnSe—ZnSeTe, and the top surface of the cladded quantum dot layers may have a semiconductor layer or metal layer serving as the gate.

It should be appreciated that the above nonvolatile memory device may be configured to serve as the nonvolatile dynamic random access memory (DRAM) and/or the nonvolatile static random access memory (SRAM).

It should also be appreciated that the devices disclosed herein may include 2 (two) drains. Any processing methodologies suitable to the desired end purpose (such as SOI and/or 3-D processing methodologies) may be used to fabricate the twin drain SWS-FETs and circuits using them. It should also be appreciated that conventional FETs have one source, one drain and one gate. It should be further appreciated that the devices described herein may include two or more transport channels (incorporating asymmetric coupled quantum wells), one or more (such as two) sources, one (or more) gate and two (or more) drains depending on the construction of the transport channel and any processing methodologies suitable to the desired end purpose may be used to fabricate these devices.

In accordance with the present invention, Site-specific Self Assembly (SSA) of $SiO_x$—Si cladded nanodots as processing step to deposit cladded nanodots. Two aspects of this SSA technique are disclosed herein. It should be appreciated that an n-channel QD-gate nonvolatile structure where cladded $SiO_x$—Si nanodots are deposited by site-specific self-assembly (SSA) technique on the gate insulator #1 is achievable. Gate insulator #2 is a conventional insulator layer under the control gate. In accordance with the invention, the SSA technique provides two features: (i) it serves as a nanomask enabling (lateral size reduction) smaller than mask feature channel lengths, and (ii) it allows for the formation of the QD gate by assembling dots over the thin insulator #1 which in turn is over the transport channel in the p-Si region. Moreover, SSA provides lateral size reduction by using rapid thermal annealing which produces larger n-regions (that is, source and drain extensions or LDS regions) and reduces the size of a mask feature. Accordingly, once the channel region is defined by masks or other appropriate lithographic technique, cladded $SiO_x$—Si nanodots may be deposited via site-specific self-assembly (SSA) on gate insulator #1 to form the floating gate of the nonvolatile memory.

Overview of Simulation of Device Structure:

Referring to Table I, Table II, and Table III below, the various parameters used in simulations are listed (see also

[0060] for details on layers in Table I). Similarly, Table Ii describes the parameters used in the simulation of QDot gate 3-state SWS device. In a similar manner, Table III describes the parameters for InGaAs quantum wells and InAlAs barriers. Here the gate insulator is II-VI material. However, other parameters suitable to the desired end result may be used.

sions using appropriate mask set. After the source and drain diffusions/implants are completed, and the gate window is opened, an ultra-thin oxide about a thickness (as determined by the FET design) of about ~2.0 nm is grown on the substrate via any suitable method, such as by dry oxidation. Alternately, a layer of lattice-matched wide energy gap semicon-

TABLE I

Layer structure of a Twin Drain SWS-FET device in SiGe system with not QDs in gate.

| Layer | Thick (µm) | Chi (eV) | Eg (eV) | me | mh | εr | Nd(cm$^{-3}$) | Na (cm$^{-3}$) |
|---|---|---|---|---|---|---|---|---|
| SiO2 gate insulator | varies | 0.90 | 9.00 | 0.50 | 0.50 | 3.90 | 0.0e00 | 0.0e00 |
| Si Well W1 | 0.0020 | 4.15 | 1.12 | 0.19 | 0.49 | 11.9 | 1.0e16 | 0.0e00 |
| SiGe (.5) | 0.0015 | 3.9 | 0.89 | 0.13 | 0.38 | 14.0 | 0.0e00 | 0.0e00 |
| Si | 0.0050 | 4.15 | 1.12 | 0.19 | 0.49 | 11.9 | 1.0e16 | 0.0e00 |
| SiGe (.5) | 0.0050 | 3.9 | 0.89 | 0.13 | 0.38 | 14.0 | 0.0e00 | 0.0e00 |
| SiGe (.75) | 0.0050 | 3.9 | 0.99 | 0.13 | 0.38 | 14.0 | 0.0e00 | 0.0e00 |
| Si Subst | 0.5000 | 4.15 | 1.12 | 0.19 | 0.49 | 11.9 | 0.0e00 | 1.0e16 |

Chi (electron affinity),
Eg (bandgap),
me (electron effective mass),
mh (hole effective mass),
εr (dielectric constant of the semiconductor),
Nd (donor concentration),
Na (acceptor concentration).

TABLE II

Layer structure of a 3-state QD gate device with Twin Drain SWS FET in SiGe system (used for simulation purposes only as a guide).

| Layer | Thick (µm) | Chi (eV) | Eg (eV) | me | mh | εr | Nd (cm$^{-3}$) | Na (cm$^{-3}$) |
|---|---|---|---|---|---|---|---|---|
| SiO2 | 0.0010 | 0.90 | 9.00 | 0.50 | 0.50 | 3.90 | 0.0e00 | 0.0e00 |
| SiQD | 0.0040 | 4.15 | 1.12 | 0.19 | 0.49 | 11.9 | 0.0e00 | 0.0e00 |
| SiO2 | 0.0020 | 0.90 | 9.00 | 0.50 | 0.50 | 3.90 | 0.0e00 | 0.0e00 |
| SiQD | 0.0040 | 4.15 | 1.12 | 0.19 | 0.49 | 11.9 | 0.0e00 | 0.0e00 |
| SiO2 | 0.0020 | 0.90 | 9.00 | 0.50 | 0.50 | 3.90 | 0.0e00 | 0.0e00 |
| Si Well W1 | 0.0020 | 4.15 | 1.12 | 0.19 | 0.49 | 11.9 | 1.0e16 | 0.0e00 |
| SiGe (.5) | 0.0015 | 3.9 | 0.89 | 0.13 | 0.38 | 14.0 | 0.0e00 | 0.0e00 |
| Si Well W2 | 0.0050 | 4.15 | 1.12 | 0.19 | 0.49 | 11.9 | 1.0e16 | 0.0e00 |
| SiGe (.5) | 0.0050 | 3.9 | 0.89 | 0.13 | 0.38 | 14.0 | 0.0e00 | 0.0e00 |
| SiGe (.75) | 0.0050 | 3.9 | 0.99 | 0.13 | 0.38 | 14.0 | 0.0e00 | 0.0e00 |
| Si subst | 0.5000 | 4.15 | 1.12 | 0.19 | 0.49 | 11.9 | 0.0e00 | 1.0e16 |

TABLE III

Layered structure for an ACQW InGaAs-InP based SWS-FET (simulation purposes).

| # Layer | Thick (µm) | Chi (eV) | Eg (eV) | me | mhh | εr | Nd | Na |
|---|---|---|---|---|---|---|---|---|
| 7. ZnMgSeTe | 0.0020 | >3.8 | 4.00 | 0.16 | 0.50 | 8.0 | 0.0e00 | 1.0e16 |
| 6. InGaAs W1 | 0.0020 | 4.51 | 0.75 | 0.04 | 0.44 | 13.9 | 0.0e00 | 1.0e16 |
| 5. InAlAs Barrier | 0.0015 | 4.0 | 1.47 | 0.084 | 0.58 | 12.4 | 0.0e00 | 1.0e16 |
| 4. InGaAs W2 | 0.0050 | 4.51 | 0.75 | 0.04 | 0.44 | 13.9 | 0.0e00 | 1.0e16 |
| 3. InAlAs barrier | 0.10 | 4.0 | 1.47 | 0.084 | 0.58 | 12.4 | 0.0e00 | 1.0e16 |
| 2. Buffer InGaAs | 0.20 | 4.51 | 0.75 | 0.04 | 0.44 | 13.9 | 0.0e00 | 1.0e16 |
| 1. InP subst | 0.5000 | 4.34 | 1.344 | 0.075 | 0.58 | 12.5 | 0.0e00 | 1.0e16 |

Regarding MOS device fabrication, this starts with the selection of appropriate substrates including a p-Si substrate, a InP substrate with an appropriate resistivity, and/or a silicon-on-insulator (SOI) substrate (with appropriate semiconductor layer thickness and resistivity). The sample goes through the conventional source and drain implants or diffuductors (such as ZnMgS, ZnMgBeS) or high-k insulators (e.g. hafnium aluminum oxide, PZT) may be grown. This may be followed by deposition of one or more layers (two layers for 3-state FET) of about 4-8 nm Si nanocrystals with about ~1 nm SiO$_x$ cladding which are self-assembled in the gate region over the p-type channel. In the case of 3-state device on SWS-FET using InGaAs quantum wells, the GeOx-cladded Ge nanocrystals may be preferred, although other materials suitable to the desired end purpose may be used. It should be appreciated that this site-specific self-assembly is as described in U.S. Pat. No. 7,368,370 to Jain et al, the contents of which are incorporated herein by reference in its entirety. Generally, this may be done by immersion of the wafer in a supernatant which may include $SiO_x$—Si, GeOx-Ge QD/nanoparticles for a certain duration which results in one or two layers. It should be appreciated that other methods suitable to the desired end purpose may also be used.

This may be followed by deposition of gate insulator #2 for nonvolatile QD gate memory. In the case of 3-state QD-gate FETs, no intentional insulator may be grown or its thickness may be very small. Now a gate material (such as metal or poly-Si or poly-SiGe gate) may be deposited per design of scaled down FET. This is followed by the deposition of a source and drain Ohmic contact layer, and a gate contact material layer. The fabricated devices may then be interconnected by following a suitable process interconnect methodology.

In one embodiment involving the method of fabrication of InP devices, an InGaAs—InAlAs asymmetric coupled well channel may be used as the starting epitaxial layered structure which is grown on a semi-insulating InP substrate. This is equivalent of a semiconductor on a insulator (SOI). The difference in the process cycle from Si is in terms of the techniques for forming the source and drain implants and the diffusions as well as the gate insulator over which SiOx-Si quantum dots are assembled. Once the source and drain regions are formed, for example using a $SiO_2$ masking layer, a thin layer of lattice-matched wide energy gap semiconductor (such as ZnMgBeSeTe, ZnMgSeTe) may be epitaxially grown. This is because of the fact that there is no native oxide for a III-V material system. $GeO_x$—Ge dots are self-assembled. Although $GeO_x$ may be used as it needs lower annealing temperatures following deposition, and this is compatible with InGaAs—InP based devices, other materials may be used as well. GeOx-Ge cladded quantum dots can also be assembled if a low-temperature annealing process is used. The three-state device has no intentional gate insulator #2 between the QDs and the gate material. However, the non-volatile memory does have an insulator layer. These are detailed in previous figures.

It should be appreciated that a logic circuit having two SWS field-effect transistors configured like a Complementary Metal Oxide Semiconductor (CMOS) inverter with at least one output is provided, where the logic circuit includes at least two n-channel field effect transistors. The first n-channel field effect transistor may include a gate region with a width to length ratio, and second n-channel field effect transistor may include a gate region with a different width to length ratio. The first n-channel field-effect transistor may include an n-channel source region, an n-channel drain region, an n-channel gate region and an n-channel transport channel, wherein the n-channel transport channel may be configured to host electrons when the n-channel gate region is biased above a first threshold level, the n-channel transport channel being associated with a p-type substrate region. The second n-channel field-effect transistor may include an n-channel source region, an n-channel drain region, an n-channel gate region and an n-channel transport channel, wherein the n-channel transport channel may be configured to host electrons when the n-channel gate region is biased above a second threshold level, the n-channel transport channel being associated with a p-type substrate region.

The transport channels of the first and second transistors may be electrically insulated by an insulating region, where the insulating region may include an oxide layer or higher energy gap high resistivity semiconductor region and wherein the first transistor n-channel gate region and the second transistor n-channel gate region are electrically connected, and the gate region is connected to an input signal. The first n-channel includes an upper first n-channel quantum well and a lower first n-channel quantum well forming first n-channel asymmetric coupled quantum wells, wherein the first n-channel asymmetric coupled quantum wells being separated by barrier layers, and the upper first n-channel quantum well being connected to a first drain region, and the lower first n-channel quantum well being connected to a second drain region, wherein the first drain region is not electrically connected. The second n-channel includes an upper second n-channel quantum well and a lower second n-channel quantum well forming second n-channel asymmetric coupled quantum wells, the second n-channel asymmetric quantum wells being separated by barrier layers, and the upper second n-channel quantum well being connected to a first drain region, and the lower second n-channel quantum well being connected to a second drain region, and wherein the second drain region of the second transistor is not electrically connected, and the second drain of the lower quantum well n-channel of the first transistor is connected to the first drain of the upper quantum well n-channel of the second transistor to form the output. The n-channel source region of the second transistor may be connected to a common ground potential or a common bias potential, and the n-channel source region of the first transistor may be connected to a supply voltage.

Additionally, the transport channel region may includes InGaAs quantum wells and InAlAs barriers to form a coupled quantum well channel, where the transport channel may be grown on a p-InGaAs layer, and the p-InGaAs layer may be grown on at least one substrate constructed from at least one of doped-InP or semi-insulating InP, wherein the gate region includes a thin layer of material from at least one of ZnMgBeSeTe, ZnSe, ZnS, ZnMgSeTe, or ZnMgS wide energy gap semiconductor materials.

In accordance with one embodiment of the invention, one method of processing SWS FETs as disclosed herein includes creating at least one source region, at least one drain region and a gate region over a semiconductor substrate selected from a list which includes at least one of Si, Ge, InP, GaAs, SiC, Si on insulator, InGaAs-on-InP, Si on sapphire, Ge on GaAs, GaN on Sapphire and/or GaN on SiC. A transport channel including layers of quantum wells separated by barriers having higher energy gap and of commensurate thickness to form a asymmetric coupled well structure is created, wherein the quantum wells and barriers may be selected from a pair of Si and SiGe, InGaAs and InAlAs, Ge and ZnSe, Ge and ZnSSe, and/or InGaN and GaN, wherein the quantum well and barrier layers may be compatible with the selected substrate. Between the source and the drain under the gate region, the source and drain formed by a method selected from ion implantation, diffusions, re-growth of doped InGaAs, re-growth of doped InP, re-growth of doped InGaN, in a semiconductor substrate, wherein the gate region may be a multilayer structure having a thin first gate insulator layer deposited using chemical vapor deposition of wide energy lattice-matched semiconductor, strained semiconductors, or thermal oxidation of Si, or deposition of insulating material which have higher dielectric constant and wider energy gap. The first barrier layer having on it a gate electrode selected from a list of semiconductors, poly-Si, SiGe, and metals selected from a list of Al, TiN, TaN. The semiconductor gate electrode is contacted by a material forming an Ohmic contact, wherein the at least one drain region D2 (second drain) is etched to open window to grow a doped semiconductor layer contacting the lower well of the coupled well transport channel, and follow with depositing an insulator material to electrically isolate the drain region D2 from other quantum wells. Next, drain Ohmic contacts are deposited on the second drain region D2 contacting the lower well, and on the first drain region D1 to contact the upper well forming the first drain, wherein the two drain contacts are topologically in two different areas to avoid overlap, thereby rendering the field-effect transistor to serve as a SWS device manifesting two channels with their own drain regions and source regions.

Moreover, an embodiment of a method of processing a 3-state SWS FET is provided and includes creating at least one source region, at least one drain region and a gate region over a semiconductor substrate selected from a list of Si, Ge, InP, GaAs, SiC, Si on insulator, InGaAs-on-InP, Si on sapphire, Ge on GaAs, GaN on Sapphire, GaN on SiC. A transport channel including layers of quantum wells separated by barriers having higher energy gap and of commensurate thickness to form a asymmetric coupled well structure is created, wherein the quantum wells and barriers are selected from a pair of Si and SiGe, InGaAs and InAlAs, Ge and ZnSe, Ge and ZnSSe, and/or InGaN and GaN, where the quantum well and barrier layers are compatible with the selected substrate. Between the source and the drain under the gate region, the source and drain may be formed by a method selected from ion implantation, diffusions, re-growth of doped InGaAs, re-growth of doped InP, re-growth of doped InGaN, in a semiconductor substrate, wherein the gate region may be a multilayer structure having a thin first gate insulator layer deposited using chemical vapor deposition of wide energy lattice-matched semiconductor, strained semiconductors, or thermal oxidation of Si, or deposition of insulating material which have higher dielectric constant and wider energy gap. The first gate insulator layer having on it two layers of cladded quantum dots may be constructed from a selected group of $SiO_x$—Si and $GeO_x$—Ge, that are assembled selectively on the transport channel using a process selected from site-specific self-assembly and layer-by-layer assembly. The self-assembled two layers of $SiO_x$—Si or $GeO_x$—Ge quantum dots are annealed in the range of about 450 to about 900 C, a gate control electrode selected from a list of semiconductors poly-Si, SiGe, and metals TiN, TaN with desired work function may be deposited over the two layers of $SiO_x$-cladded Si or $GeO_x$—Ge nanocrystal quantum dots and at least one drain region D2 (second drain) may be etched to open a window to grow a doped semiconductor layer contacting the lower well of the coupled well transport channel. An insulator material may be deposited to electrically isolate the drain region D2 from other quantum wells, and a drain Ohmic contact may be deposited on the second drain region D2 to contact the lower well. Also, the method may include depositing Ohmic contact on the first drain region D1 to contact the upper well forming the first drain, where the two drain contacts are topologically in two different areas to avoid overlap thereby rendering the field-effect transistor to serve as a 3-state device manifesting an intermediate state 'i' in the transfer (drain current-gate voltage) characteristic.

Moreover, another embodiment includes a SWS field-effect transistor nonvolatile memory device which includes a source region, a gate region, and a drain region, wherein the gate region is configured to store charge in at least one cladded quantum dot layer, the gate region is configured to control charge carrier location in a transport channel region, wherein the transport channel region includes a asymmetric coupled quantum well layer having at least two quantum wells of different thicknesses, separated by a barrier layer having a greater energy gap than the at least two quantum wells, wherein the transport channel region is connected to the source region at a first transport channel end and the drain region at a second transport channel end, and the transport channel is hosted on a semiconductor layer doped to provide n-channel or p-channel. The semiconductor layer is hosted on a substrate region, wherein the drain region includes at least two contacts electrically isolated from each other and connected to at least one of the at least two quantum wells, and wherein the gate region includes a multilayer structure having a first thin insulator layer of about 10-100Å in thickness, the first thin insulator layer being deposited on top of a semiconductor region hosting the transport channel region between the source region and the drain region, wherein a surface of the first thin insulator layer includes at least one layer of cladded quantum dots, wherein the top surface of the at least one layer of cladded quantum dots includes a second thin insulator layer. The second insulator layer serving as a control dielectric layer, wherein the second insulator layer having deposited on its surface at least one layer selected from poly-Si, poly-Ge, poly-SiGe and/or a metal layer, thereby rendering the SWS-FET device as a nonvolatile memory device whose states may be written and read from one or both drain regions.

Furthermore, one embodiment of a method of processing the above discussed quantum dot gate nonvolatile memory includes creating a field-effect transistor (FET) structure with a source, a drain and a gate region over a semiconductor substrate, where the transport channel includes layers commensurate to form a coupled well or a single well. Between the source and the drain under the gate region, the source and drain may be formed by a method selected from ion implantation and diffusions in a semiconductor substrate, wherein the gate region may be a multilayer structure having: a first layer deposited using chemical vapor deposition or thermal oxidation and whose material is selected from a group which includes insulators (such as $SiO_2$ and hafnium oxide) and/or a wide energy semiconductor and/or lattice matched semiconductor and/or a pseudomorphic semiconductor. The first layer having on it a first set of one or more layers of cladded quantum dots from a selected group of $SiO_x$—Si and $GeO_x$—Ge, that are assembled selectively on the transport channel using process selected from site-specific self-assembly and/or layer-by-layer deposition. The layer of $SiO_x$—Si and/or $GeO_x$—Ge quantum dots may be annealed in the range of 500-900 C, a second insulator layer selected from a list of SiON, $SiO_2$, $Si_3N_4$ may be deposited using chemical vapor deposition method on top of the layer of $SiO_x$—Si or $GeO_x$—Ge dots if desired. A gate control electrode selected from a list of semiconductors poly-Si, SiGe, and metals TiN, TaN with desired work function is deposited over the third insulator over the layer of cladded quantum dots, the at least one drain region D2 (second drain) is etched to open a window to grow doped semiconductor layer contacting the lower well of the coupled well transport channel, and follow with depositing an insulator material to electrically isolate the drain region D2 from other quantum wells. The method may further include depositing drain Ohmic contacts on the second drain region D2 contacting the lower well, depositing Ohmic contact on the first drain region D1 to contact the upper well forming the first drain, wherein the two drain contacts are topologically in two different areas to avoid overlap, thereby rendering the SWS-FET device as a nonvolatile memory device whose states may be written and read from one or both drain regions.

It should be appreciated that the Spatial Wavefunction Switching (SWS) field-effect transistor discussed hereinabove may be configured to host electrons when the gate region is biased above a threshold level, the transport channel being associated with a p-type semiconductor layer and p-type substrate region, wherein the transport channel has a width (Z) which is in the range of about 8-12 nm, and the transport channel has a length (L) of about 10-12 nm, thereby rendering the SWS-FET device as a quantum dot FET with at least two vertically coupled quantum dots. Moreover, the Spatial Wavefunction Switching (SWS) field-effect transistor may be configured such that the transport channel is configured to host electrons when the gate region is biased above a threshold level, the transport channel being associated with a p-type semiconductor layer and a p-type substrate region, wherein the transport channel has a width (Z) which is in the range of about 8-12 nm, and the transport channel has a length (L) of about 15-100 nm, thereby rendering the SWS-FET device as a quantum wire FET with at least two vertically coupled quantum wires.

Moreover, an additional embodiment includes a charge coupled device having at least two SWS field-effect devices, each which includes a gate region, wherein the gate region includes a thin gate insulator layer and at least one additional layer configured to serve as an electrical gate contact, the gate region being configured to control charge carrier vertical location in a transport channel, wherein one end of the transport channel is located in proximity to the region that provides charge carriers in it's the transport channel. The other end of the transport channel is located in proximity to another SWS device, the gates of the SWS devices are separated by a thin region, wherein the thin region is separating the gate regions of adjacent SWS devices and hosts a thicker insulator layer, the thicker insulator layer in the gate region separates the two SWS devices, where the relative voltage at the gate contact of the SWS devices determines the lateral location of the charge in the quantum well of a device. The transport channels of both SWS devices include a asymmetric coupled quantum well layer having at least two quantum wells and at least two barrier layers, wherein the quantum wells and barrier layers may be selected from semiconductor materials, the wells being implemented using lower energy gap materials than the barrier layers that are implemented using semiconductors with higher energy gap. The at least two quantum wells including an upper well and a lower well, each of the upper well and the lower well having a well thickness and a well material composition, wherein the upper well and the lower well differ in at least one of the well thickness, and wherein the at least two barrier layers include an upper barrier and a lower barrier, the lower barrier being located in proximity to a substrate region, wherein one side of the upper well is located in proximity to the thin gate insulator layer and the other side of the upper well is located in proximity to the upper barrier, and wherein one side of the lower well is located in proximity to the upper barrier and the other side of the lower well is located in proximity to the lower barrier, and wherein the transport channel, including quantum wells and barriers, is located on top of a semiconductor layer, and said semiconductor layer which is hosted on a substrate selected from semiconductor selected from a list of Si, Ge, InP, GaAs, SiC, ZnSe, ZnS.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

What is claimed is:

1. A Spatial Wavefunction Switching (SWS) field-effect transistor device, comprising:
   a source region,
   a gate region, and
   a drain region,
      wherein said gate region includes a thin gate insulator layer and at least one additional layer configured to serve as an electrical gate contact, said gate region being configured to control charge carrier location in a transport channel, wherein one end of said transport channel is located in proximity to said source region and the other end of said transport channel is located in proximity to said drain region,
   said transport channel includes a asymmetric coupled quantum well layer having at least two quantum wells and at least two barrier layers, wherein said at least two quantum wells and barrier layers are selected from semiconductor materials and wherein said at least two quantum wells are implemented using materials having a lower energy gap than materials used to implement said barrier layers,
   wherein said at least two quantum wells including an upper well and a lower well, each of said upper well and said lower well having a well thickness and a well material composition, wherein said upper well and said lower well differ in said well thickness, and
   wherein said at least two barrier layers include an upper barrier and a lower barrier, said lower barrier being located in proximity to a substrate region,
   wherein one side of said upper well is located in proximity to said thin gate insulator layer and the other side of said upper well is located in proximity to said upper barrier, and
   wherein one side of said lower well is located in proximity to said upper barrier and the other side of said lower well is located in proximity to said lower barrier, and wherein said transport channel, includes at least one of said quantum wells and at least one of said barriers and is located on top of a semiconductor layer, wherein said semiconductor layer is hosted on a substrate selected from semiconductor selected from a list of Si, Ge, InP, GaAs, SiC, ZnSe, ZnS, and
   wherein said drain region includes two contacts electrically isolated from each other, wherein one of said two contacts is connected to said upper well to form a first drain region and the other of said two contacts is connected to said lower well to form a second drain region, and
   wherein said source region includes at least one contact, wherein said at least one contact is connected to at least one of said upper quantum well and said lower quantum well to form at least one source input.

2. The Spatial Wavefunction Switching (SWS) field-effect transistor device of claim 1, wherein said transport channel is configured to host electrons when said gate region is biased above a threshold level, said transport channel being associated with a p-type semiconductor layer and a p-type substrate region.

3. The Spatial Wavefunction Switching (SWS) field-effect transistor device of claim 1, where said transport channel is configured to hosts holes when said gate region is biased above a threshold level, said transport channel being associated with a n-type semiconductor layer and a p-type substrate region.

4. The Spatial Wavefunction Switching (SWS) field-effect transistor device of claim 1, where said at least one additional layer in the gate region, includes two additional layers, one of said two additional layers being constructed from at least one of a semiconductor material, quantum dot layers, or an insulator material.

5. The Spatial Wavefunction Switching (SWS) field-effect transistor device of claim 1, wherein said transport channel includes three quantum wells and three barrier layers, wherein one of said drain regions connects to one of said three quantum wells located nearest to said substrate region, and wherein the other of said drain regions connects to one of said three quantum wells located nearest to said gate insulator layer.

6. The Spatial Wavefunction Switching (SWS) field-effect transistor device of claim 1, further comprising a third drain region, wherein said transport channel includes three quantum wells and three barriers, each of said three quantum wells being connected to each of said drain regions such that a quantum well is connected to only one drain region.

7. The Spatial Wavefunction Switching (SWS) field-effect transistor device of claim 1, wherein there are two sources, with first source connecting to the upper well and the second source connecting to the lower well.

8. The Spatial Wavefunction Switching (SWS) field-effect transistor device of claim 1, wherein said upper well is constructed from a first semiconductor material and said lower well is constructed from second semiconductor material, wherein said first semiconductor material has a different energy gap than said second semiconductor material.

9. The Spatial Wavefunction Switching (SWS) field-effect transistor of claim 1, wherein said substrate region may be selected from a list comprised of a doped bulk substrate, a doped semiconductor thin film-on-insulator substrate, and a doped semiconductor thin film on semi-insulating semiconductor substrate.

10. A logic circuit having two SWS field-effect transistors configured as a Complementary Metal Oxide Semiconductor (CMOS) inverter with at least two outputs, the logic circuit comprising:
an n-channel field-effect transistor having a n-channel source region, a n-channel drain region, a n-channel gate region and a n-channel transport channel, wherein said n-channel transport channel is configured to host electrons when said n-channel gate region is biased above a first threshold level, said n-channel transport channel being associated with a p-type substrate region, and
a p-channel field-effect transistor having a p-channel source region, a p-channel drain region, a p-channel gate region and a p-channel transport channel, wherein said p-channel transport channel is configured to hosts holes when said p-channel gate region is biased above a second threshold level, said p-channel transport channel being associated with a n-type substrate region,
wherein said n-channel gate region and said p-channel gate region are electrically connected, and the said gate region is connected to an input signal, and
wherein said n-channel includes an upper quantum well and a lower quantum well, said upper quantum well and said lower quantum well forming asymmetric coupled quantum wells, said asymmetric coupled quantum wells separated by barrier layers, and wherein said upper quantum well n-channel is connected to first drain region, and said lower well n-channel connected to second drain region,
wherein said p-channel includes an upper quantum well and a lower quantum well said upper quantum well and said lower quantum well forming an asymmetric coupled quantum wells, said wells separated by barrier layers, and wherein said upper quantum well p-channel is connected to first drain region, and said lower well p-channel connected to second drain region,
said first drain region of said n-channel is connected to the said first drain region of said p-channel to form one of the at least two outputs, and said second drain region of said n-channel is connected to said second drain region of said p-channel to form the other of the at least two outputs, and
wherein said n-channel source region is connected to at least one of a common ground potential or a common bias potential, and said p-channel source region is connected to a supply voltage.

11. The logic circuit of claim 10, wherein said n-channel source region includes a first n-channel source region and a second n-channel source region, said first n-channel source region connected to said upper quantum well of said n-channel field-effect transistor, and said second n-channel source region connected to said lower quantum well of said n-channel field-effect transistor, wherein said first n-channel source region is connected to a first potential, and said second n-channel source region is connected to a second potential, and wherein said p-channel source region of said p-channel field-effect transistor has a first p-channel source region and a second p-channel source region, wherein said first p-channel source region is connected to said upper well of said p-channel, and said second p-channel source region connected to said lower well of said p-channel, and wherein said first p-channel source region is connected to a first supply voltage, and said second p-channel source region is connected to a second supply voltage.

12. A three-state field-effect transistor device, comprising
a source region,
a gate region, and
a drain region,
wherein said gate region is configured to control charge carrier location in a transport channel region, wherein said transport channel region includes a asymmetric coupled quantum well layer having at least two quantum wells of different thicknesses, separated by a barrier layer having a greater energy gap than said at least two quantum wells, wherein said transport channel region is connected to said source region at a first transport channel end and said drain region a second transport channel end, and
wherein said transport channel is hosted on a semiconductor layer doped to provide at least one of an n-channel or a p-channel, said semiconductor layer being hosted on a substrate region, and
wherein said drain region includes at least two contacts electrically isolated from each other and connected to at least one of said at least two quantum wells, and
wherein said gate region includes a multilayer structure having a first thin insulator layer of about 10-100 Å in thickness, said first thin insulator layer being deposited on top of a semiconductor region hosting said transport channel region between said source region and said drain region, wherein a surface of said first thin insulator layer includes at least two layers of cladded quantum dots, wherein said top surface of said at least two layers of cladded quantum dot includes at least one of a semiconductor layer, a second thin insulator or a metal layer.

13. The three-state field-effect transistor device of claim 12, wherein said at least two layers of cladded quantum dots are constructed from at least one of $SiO_x$-cladded Si or $GeO_x$-cladded Ge or ZnCdSe—ZnSe nanocrystals.

14. The three-state field-effect transistor device of claim 12, wherein said first thin insulator layer is constructed from at least one of an insulator material or a wide energy gap lattice-matched semiconductor material.

15. The three-state field-effect transistor device of claim 12, wherein said first thin insulator layer material in the gate region includes at least one of $SiO_2$, $HfO_2$, $Si_3N_4$.

16. The three-state field-effect transistor device of claim 12, wherein said first thin insulator is constructed of at least one of a wide energy gap lattice-matched semiconductor, ZnMgS or ZnBeMgSSe.

17. The three-state field-effect transistor device of claim 12,
wherein said transport channel region includes InGaAs—InAlAs coupled quantum wells grown on a InGaAs—InP epitaxial substrate, and
wherein said transport channel region includes a thin layer of lattice-matched ZnMgBeSeTe wide energy gap semiconductor material, and
wherein said cladded quantum dots are constructed from at least one of $SiO_x$—Si, $GeO_x$—Ge, ZnS—CdSe, or ZnSe—ZnSeTe.

* * * * *